US009466735B2

(12) United States Patent
Tanaka

(10) Patent No.: US 9,466,735 B2
(45) Date of Patent: Oct. 11, 2016

(54) JUNCTION BARRIER SCHOTTKY DIODE AND METHOD FOR MANUFACTURING THE SAME

(71) Applicant: Synaptics Display Devices GK, Nakano-Ku, Tokyo (JP)

(72) Inventor: Tomoaki Tanaka, Nakano (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

(21) Appl. No.: 14/731,105

(22) Filed: Jun. 4, 2015

(65) Prior Publication Data

US 2015/0380570 A1 Dec. 31, 2015

(30) Foreign Application Priority Data

Jun. 25, 2014 (JP) .................................. 2014-130346

(51) Int. Cl.
*H01L 29/872* (2006.01)
*H01L 29/06* (2006.01)

(52) U.S. Cl.
CPC ......... *H01L 29/872* (2013.01); *H01L 29/0619* (2013.01); *H01L 29/0692* (2013.01); *H01L 29/0649* (2013.01)

(58) Field of Classification Search
CPC .................. H01L 29/66143; H01L 29/66212; H01L 29/7806; H01L 29/782; H01L 29/872
See application file for complete search history.

(56) References Cited

U.S. PATENT DOCUMENTS

| 6,340,836 | B1 * | 1/2002 | Shikata | H01L 29/0692 257/481 |
|---|---|---|---|---|
| 8,432,012 | B2 * | 4/2013 | Zhang | H01L 21/046 257/471 |
| 8,890,278 | B2 * | 11/2014 | Kameshiro | H01L 21/046 257/471 |
| 2005/0029615 | A1 * | 2/2005 | Tanaka | H01L 27/0814 257/484 |
| 2011/0248285 | A1 * | 10/2011 | Zhang | H01L 21/046 257/77 |
| 2014/0077226 | A1 * | 3/2014 | Kitani | H01L 29/872 257/77 |
| 2014/0145289 | A1 * | 5/2014 | Zhang | H01L 29/6606 257/475 |

FOREIGN PATENT DOCUMENTS

JP 2003188391 A 7/2003

* cited by examiner

*Primary Examiner* — Benjamin Sandvik
(74) *Attorney, Agent, or Firm* — Patterson + Sheridan, LLP

(57) ABSTRACT

A junction barrier Schottky diode is formed by shifting second semiconductor regions of a second conductivity type in a staggered shape in a first semiconductor region of a first conductivity type so that pn junction regions are formed at predetermined distances between the second semiconductor regions and the first semiconductor region. A third semiconductor region of the first conductivity type is formed between the second semiconductor regions in order to form a Schottky junction region. An electrode is formed on the second and third semiconductor regions. The second semiconductor regions arranged at equal distances in an X direction are formed in a plurality of columns in a Y direction. An amount of shift between adjacent columns in the X direction is set such that a Y-direct ion distance between the second semiconductor regions in the different columns is larger than an X-direction distance between the second semiconductor regions in each column.

8 Claims, 23 Drawing Sheets

(A-A HORIZONTAL CROSS-SECTION)

(WHEN FORWARD VOLTAGE IS APPLIED)

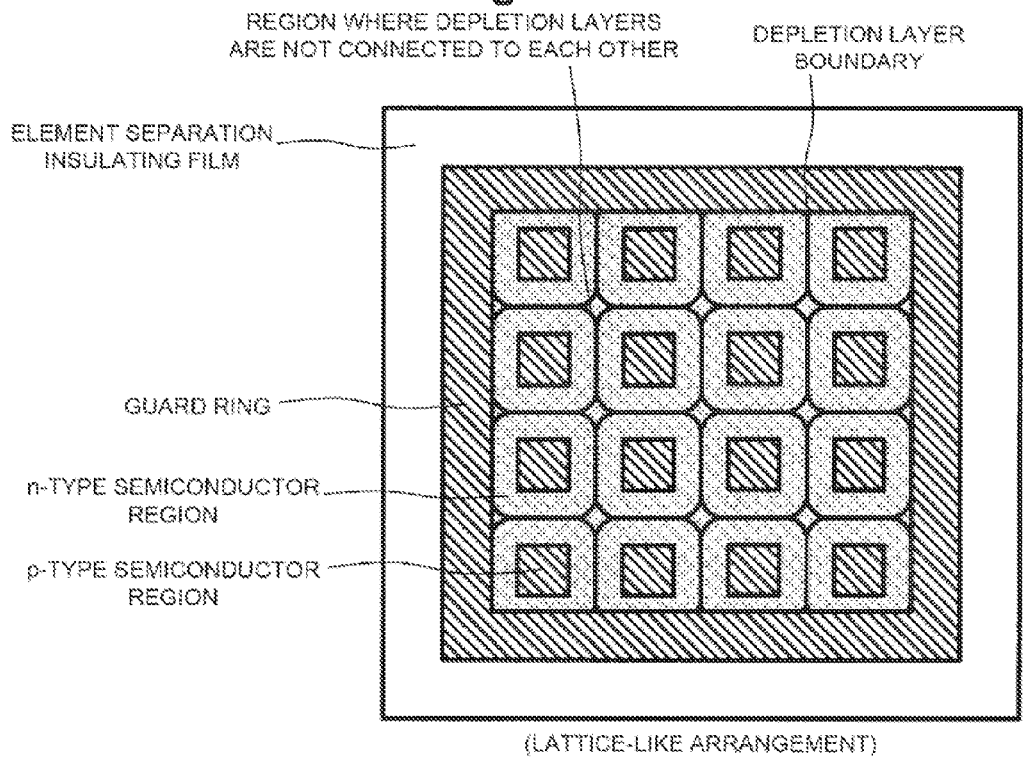
Fig. 28 (LATTICE-LIKE ARRANGEMENT)
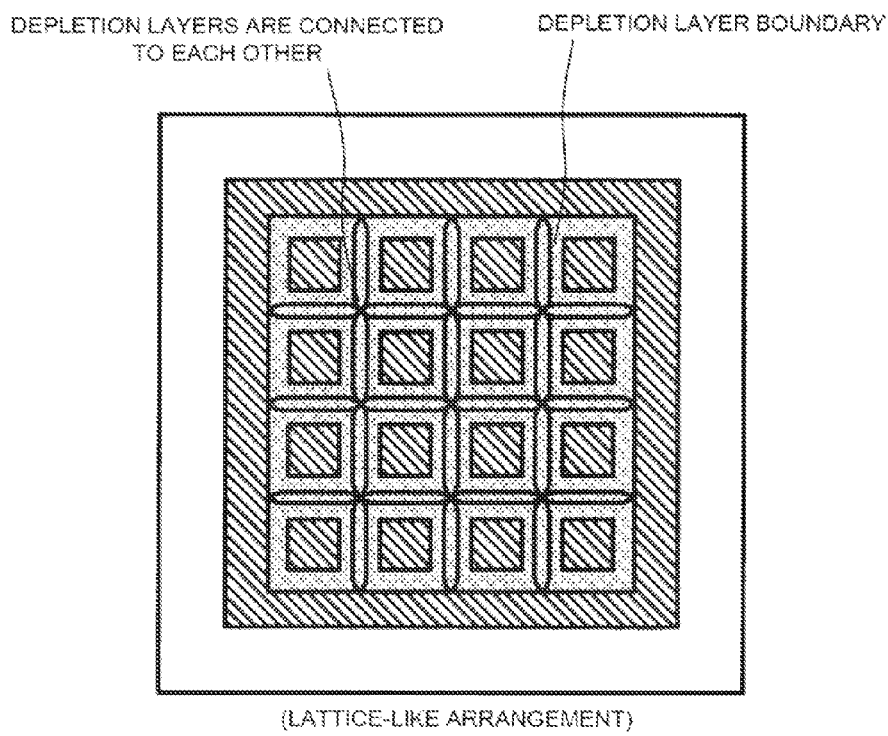
Fig. 29 (LATTICE-LIKE ARRANGEMENT)

JUNCTION BARRIER SCHOTTKY DIODE AND METHOD FOR MANUFACTURING THE SAME

CROSS-REFERENCE TO RELATED APPLICATIONS

The present application claims priority from Japanese patent application no. JP 2014-130346, filed on Jun. 25, 2014, the content of which is hereby incorporated by reference into this application.

BACKGROUND

The invention relates to a junction barrier Schottky diode and a method for manufacturing the same, and in particular, to a technique that is effectively applied to a semiconductor device represented by a liquid crystal display (LCD) driver or a complementary metal-oxide semiconductor (CMOS) integrated circuit.

A Schottky diode has a characteristic that the reverse current is large compared with that in a pn diode. The reverse current strongly depends on the electric field strength at the Schottky junction interface. As the electric field strength at the Schottky junction interface increases, the reverse current increases. In order to suppress the reverse current of the Schottky diode, for example, a known diode having a junction barrier Schottky (JBS) structure is used in which a p-type layer is formed in the anode region of an n-type layer of the Schottky diode and a pn junction is arranged in an alternating manner. The diode having a junction barrier Schottky structure (also simply referred to as a JBS diode) uses the spreading of a depletion layer of the pn junction in case that a reverse voltage is applied thereto. Since the electric field at the Schottky junction interface can be reduced by blocking an n-type semiconductor region bottom portion that is in contact with the silicide interface with the depletion layer, it is possible to suppress the reverse current. For example, FIG. 25 shows the schematic configuration of a vertical cross-section of the JBS diode when a forward voltage is applied thereto, and FIG. 26 shows the schematic configuration of a vertical cross-section of the JBS diode when a reverse voltage is applied thereto. When a forward voltage is applied, a depletion layer of the pn junction is not extended. Accordingly, current flows from the anode to the cathode. However, when a reverse voltage is applied, the depletion layer extending from the p-type layer is connected to another depletion layer of the adjacent p-type semiconductor region to block the side surface and the bottom surface of an n-type semiconductor region that is in Schottky contact therewith. Therefore, since it is possible to reduce the electric field at the Schottky junction interface, it is possible to suppress the reverse current. Since the size of the depletion layer depends on the applied reverse voltage, the size is determined by the power supply voltage to be used or the applied voltage.

An example of the JBS diode is disclosed in JP-A-2003-188391. In the JBS diode disclosed in JP-A-2003-188391, p-type layers within the anode are arranged at equal distances therebetween in rectangular shapes or arranged in a lattice shape. In particular, in the JBS diode disclosed in JP-A-2003-188391, in view of the fact that each $p^+$-type semiconductor region arranged below the anode electrode is a so-called inactive semiconductor region that contributes to the reduction of reverse leakage current but does not function as a current path substantially during the forward operation, the depth of each of a plurality of $p^+$-type semiconductor regions is set to be larger than the depth of an n-type epitaxial layer in order to form a Schottky junction region, so that the spreading of the $p^+$-type semiconductor region in the horizontal direction when forming the $p^+$-type semiconductor region by diffusion is limited to the n-type epitaxial layer. As a result, it is possible to prevent the occurrence of a situation where the area of the $p^+$-type semiconductor region is undesirably increased and the required amount of forward current is not obtained.

SUMMARY

Embodiments of invention provide an arrangement of a pn junction region with respect to a Schottky junction region which is suitable for increasing the forward current while reducing the reverse current.

In one embodiment, a junction barrier Schottky diode is provided that includes a first semiconductor region of a first conductivity type formed on a semiconductor substrate, a plurality of second semiconductor regions of a second conductivity type that are formed in a staggered arrangement in the first semiconductor region, pn junction regions being formed at predetermined distances between the plurality of second semiconductor regions and the first semiconductor region, a third semiconductor region of the first conductivity type that is formed between the second semiconductor regions in order to form a Schottky junction region, and an electrode formed on the second and third semiconductor regions. Each of the second semiconductor regions has a quadrangular shape in plan view from the electrode. The second semiconductor regions are arranged at equal distances in an X direction are formed in a plurality of columns in a Y direction. An amount of shift between adjacent columns in the X direction is set such that a Y-direction distance between the second semiconductor regions in the different columns is larger than an X-direction distance between the second semiconductor regions in each of the columns.

In another embodiment, a junction barrier Schottky diode is provided that includes a first semiconductor region of a first conductivity type formed on a semiconductor substrate, a plurality of second semiconductor regions of a second conductivity type that are formed in a plurality of rows and columns in the first semiconductor region, pn junction regions being formed at predetermined distances between the plurality of second semiconductor regions and the first semiconductor region, a third semiconductor region of the first conductivity type that is formed between the second semiconductor regions in order to form a Schottky junction region, and an electrode formed on the second and third semiconductor regions. Each of the second semiconductor regions has a quadrangular shape having a side with a length b in plan view from the electrode. A distance between adjacent second semiconductor regions in a direction crossing the one side direction is larger than a distance c, wherein the distance c is defined between adjacent second semiconductor regions in the one side direction. An amount of shift d between adjacent second semiconductor regions in adjacent columns extending in the one side direction of the second semiconductor region satisfies a relationship of $c/2 \leq d \leq b+c/2$.

In another embodiment, a junction barrier Schottky diode is provided that includes a first semiconductor region of a first conductivity type formed on a semiconductor substrate, a plurality of second semiconductor regions of a second conductivity type that are formed in a plurality of rows and columns in the first semiconductor region, pn junction regions being formed at predetermined distances between the plurality of second semiconductor regions and the first semiconductor region, a third semiconductor region of the first conductivity type that is formed between the second semiconductor regions in order to form a Schottky junction region, and an electrode formed on the second and third semiconductor regions. Each of the second semiconductor regions has a quadrangular shape having a side with a length b in plan view from the electrode. An extendable size of a depletion layer from an edge of the second semiconductor region when a predetermined reverse voltage is applied is a in the plan view. A distance between adjacent second semiconductor regions in the one side direction is $a\sqrt{2}$. A distance between adjacent second semiconductor regions in a direction crossing the one side direction is $a+a/\sqrt{2}$. An amount of shift d between adjacent second semiconductor regions in adjacent columns extending in the one side direction of the second semiconductor region satisfies a relationship of $a/\sqrt{2} \le d \le b+a/\sqrt{2}$.

In another embodiment, a method for manufacturing a junction barrier Schottky diode is provide that includes forming a first semiconductor region of a first conductivity type on a semiconductor substrate, forming a plurality of second semiconductor regions of a second conductivity type in a staggered arrangement in the first semiconductor region, pn junction regions being formed at predetermined distances between the plurality of second semiconductor regions and the first semiconductor region, forming a third semiconductor region of the first conductivity type on the first semiconductor region between the second semiconductor regions in order to form a Schottky junction region, and forming an electrode on the second and third semiconductor regions, wherein each of the second semiconductor regions is formed in a quadrangular shape in plan view from the electrode, the second semiconductor regions arranged at equal distances in an X direction are formed in a plurality of columns in a Y direction, and an amount of shift between adjacent columns in the X direction is set such that a Y-direction distance between the second semiconductor regions in the different columns is larger than an X-direction distance between the second semiconductor regions in each of the columns.

In yet another embodiment, a method for manufacturing a junction barrier Schottky diode includes forming a first semiconductor region of a first conductivity type on a semiconductor substrate, forming a plurality of second semiconductor regions of a second conductivity type in a plurality of rows and columns in the first semiconductor region, with pn junction regions being formed at predetermined distances between the plurality of second semiconductor regions and the first semiconductor region, forming a third semiconductor region of the first conductivity type on the first semiconductor region between the second semiconductor regions in order to form a Schottky junction region, and forming an electrode on the second and third semiconductor regions so as to overlap each other, wherein each of the second semiconductor regions has a quadrangular shape having a side with a length b in plan view from the electrode, and wherein a distance between adjacent second semiconductor regions in the one side direction is c, a distance between adjacent second semiconductor regions in a direction crossing the one side direction is larger than the distance c, and an amount of shift d between adjacent second semiconductor regions in adjacent columns extending in the one side direction of the second semiconductor region satisfies a relationship of $c/2 \le d \le b+c/2$.

In still another embodiment, a method for manufacturing a junction barrier Schottky diode is provided that includes forming a first semiconductor region of a first conductivity type on a semiconductor substrate, forming a plurality of second semiconductor regions of a second conductivity type in a plurality of rows and columns in the first semiconductor region, with pn junction regions being formed at predetermined distances between the plurality of second semiconductor regions and the first semiconductor region, forming a third semiconductor region of the first conductivity type on the first semiconductor region between the second semiconductor regions in order to form a Schottky junction region, and forming an electrode on the second and third semiconductor regions, wherein each of the second semiconductor regions has a quadrangular shape having a side with a length b in plan view from the electrode, and wherein an extendable size of a depletion layer from an edge of the second semiconductor region when a predetermined reverse voltage is applied is a in the plan view, a distance between adjacent second semiconductor regions in the one side direction is a $\sqrt{2}$, a distance between adjacent second semiconductor regions in a direction crossing the one side direction is $a+a/\sqrt{2}$, and an amount of shift d between adjacent second semiconductor regions in adjacent columns extending in the one side direction of the second semiconductor region satisfies a relationship of $a/\sqrt{2} \le d \le b+a/\sqrt{2}$.

BRIEF DESCRIPTION OF THE DRAWINGS

FIG. 28 is a plan view for explaining that, in the case of a lattice-like arrangement, the area ratio of the p-type semiconductor region is reduced but it is difficult for depletion layers to be connected to each other at the intersection of the lattice.

FIG. 29 is a plan view for explaining that it is desired to make the distance between p-type semiconductor regions smaller than in FIG. 28 in order to suppress an increase of the reverse current.

DETAILED DESCRIPTION

Introduction

Figure 27:
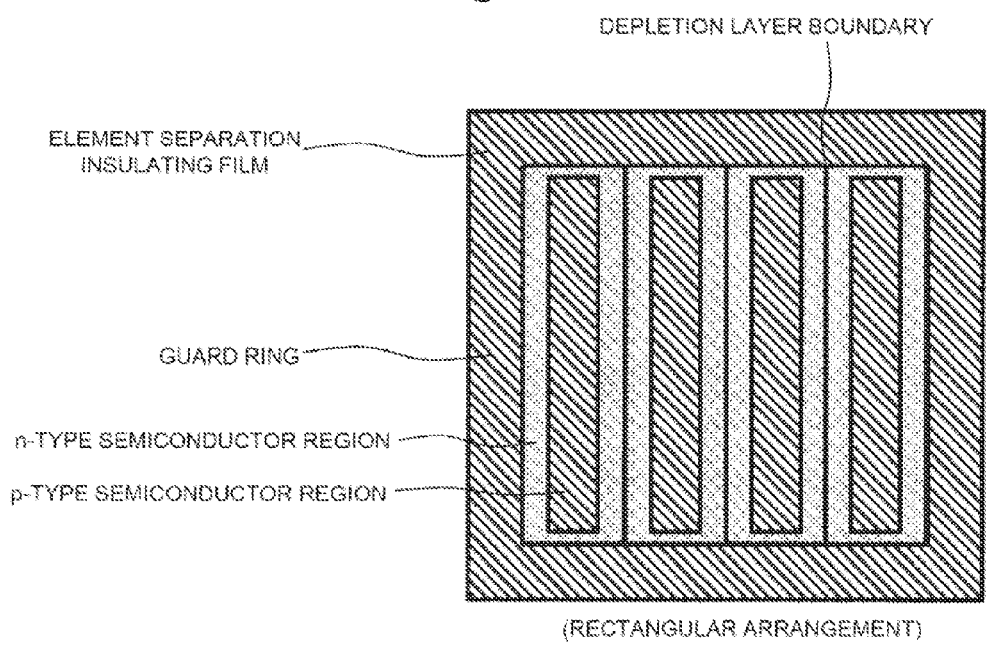
FIG. 27 is a plan view for explaining that, in order to suppress a reverse current when a pn junction having a vertically-long rectangular shape is arranged in an alternating manner, n-type semiconductor regions adjacent to each other in the horizontal direction are blocked by the depletion layer and accordingly control becomes easy; however, the forward current is reduced since the area ratio of the p-type semiconductor region is large.

Since the p-type semiconductor region within the anode of the JBS diode does not contribute to the forward current as described above, the forward current increases as the area ratio of the p-type semiconductor region to the anode area decreases. However, if the distance between the p-type semiconductor regions is increased too far in order to reduce the area ratio of the p-type semiconductor region, depletion layers are not connected to each other and accordingly the reverse current is increased. When a pn junction having a vertically-long rectangular shape is arranged in an alternating manner as in FIG. 27, n-type semiconductor regions adjacent to each other in the horizontal direction may be blocked by the depletion layer in order to suppress the reverse current. In this case, control becomes easy. However, since the area ratio of the p-type layer is large, the forward current is reduced. When pn junctions are arranged in a lattice shape as in FIG. 28, the area ratio of the p-type semiconductor region is reduced, but it is difficult for depletion layers to be connected to each other at the intersection of the lattice. Accordingly, in order to suppress the increase of the reverse current, it is desired to make the distance between the p-type semiconductor regions smaller than in FIG. 28 as shown in FIG. 29. In this case, the area ratio of the p-type semiconductor region is increased, and the forward current is reduced. The technique described in JP-A-2003-188391 is used to limit the spreading of the $p^+$-type semiconductor region in the horizontal direction to the n-type epitaxial layer when forming the $p^+$-type semiconductor region by diffusion so that the occurrence of a situation is prevented in which the area of the $p^+$-type semiconductor region is undesirably increased and the required amount of forward current is not obtained. Accordingly, a required amount of forward current can be obtained by suppressing the occurrence of a situation where the area ratio of the p-type semiconductor region becomes larger than the design value during manufacturing.

It is an object of the invention to provide an arrangement structure of the pn junction region with respect to the Schottky junction region, which is suitable for increasing the forward current while reducing the reverse current.

The above and other objects and novel features of the invention will become apparent from the following description with reference to the accompanying diagrams.

A brief description of the overview of the representative inventions disclosed in this application is as follows.

That is, a junction barrier Schottky diode is formed by shifting a plurality of second semiconductor regions of a second conductivity type in a staggered shape in a first semiconductor region of a first conductivity type so that pn junction regions are formed at predetermined distances between the plurality of second semiconductor regions and the first semiconductor region. A third semiconductor region of the first conductivity type is formed between the second semiconductor regions in order to form a Schottky junction region. An anode electrode is formed on the second and third semiconductor regions. Each of the second semiconductor regions has a quadrangular shape in plan view from the anode electrode. The second semiconductor regions arranged at equal distances in an X direction are formed in a plurality of columns in a Y direction. An amount of shift between adjacent columns in the X direction is set such that a Y-direct ion distance between the second semiconductor regions in the different columns is larger than an X-direction distance between the second semiconductor regions in each of the columns.

A brief description of the effects obtained by the representative inventions disclosed in this application is as follows.

That is, since the amount of shift between adjacent columns in the X direction in the staggered arrangement of the second semiconductor regions is set such that the Y-direction distance between the second semiconductor regions in the different columns is larger than the X-direction distance between the second semiconductor regions in each column, it is possible to guarantee the connection between the depletion layers when a reverse voltage is applied thereto. Therefore, compared with a case where the second semiconductor regions are arranged in a simple lattice shape or a case where the second semiconductor regions are arranged in a staggered shape at equal distances in the XY directions, it is possible to reduce the area ratio of the second semiconductor region to the third semiconductor region.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

[1] <JBS Diode Having a Reduced Area Ratio of the pn Junction Region to the Schottky Junction Region>

A junction barrier Schottky diode (1) has a first semiconductor region (3) of a first conductivity type on a semiconductor substrate (2). In the first semiconductor region, a plurality of second semiconductor regions (4) of a second conductivity type are formed in a staggered arrangement, so that pn junction regions are formed at predetermined distances between the plurality of second semiconductor regions and the first semiconductor region. A third semiconductor region (5) of the first conductivity type is formed between the second semiconductor regions in order to form a Schottky junction region, and an electrode (6) is formed on the second and third semiconductor regions. Each of the second semiconductor regions has a quadrangular shape in plan view from the electrode, and the second semiconductor regions arranged at equal distances in an X direction are formed in a plurality of columns in a Y direction. An amount of shift (d) between adjacent columns in the X direction is set such that a Y-direction distance (c') between the second semiconductor regions in the different columns is larger than an X-direction distance (c) between the second semiconductor regions in each of the columns.

In this case, since the amount of shift between adjacent columns in the X direction in the staggered arrangement of the second semiconductor regions is set such that the Y-direction distance between the second semiconductor regions in the different columns is larger than the X-direction distance between the second semiconductor regions in each column, it is possible to guarantee the connection between the depletion layers when a reverse voltage is applied thereto. Therefore, compared with a case where the second semiconductor regions are arranged in a simple lattice shape or a case where the second semiconductor regions are arranged in a staggered shape at equal distances in the XY directions, it is possible to reduce the area ratio of the second semiconductor region to the third semiconductor region. The above staggered arrangement of the second semiconductor regions is suitable for increasing the forward current while reducing the reverse current.

[2] <JBS Diode Having a Reduced Area Ratio of the pn Junction Region to the Schottky Junction Region>

A junction barrier Schottky diode (1) has a first semiconductor region (3) of a first conductivity type on a semiconductor substrate (2). In the first semiconductor region, a plurality of second semiconductor regions (4) of a second conductivity type are formed in a plurality of rows and columns, so that pn junction regions are formed at predetermined distances between the plurality of second semiconductor regions and the first semiconductor region. A third semiconductor region (5) of the first conductivity type is formed between the second semiconductor regions in order to form a Schottky junction region. An electrode (6) is formed on the second and third semiconductor regions. Each of the second semiconductor regions has a quadrangular shape having a side with a length b in plan view from the electrode. Assuming that a distance between adjacent second semiconductor regions in the one side direction is c and a distance between adjacent second semiconductor regions in a direction crossing the one side direction is larger than the distance c, an amount of shift d between adjacent second semiconductor regions in adjacent columns extending in the one side direction of the second semiconductor region satisfies a relationship of $c/2 \leq d \leq b+c/2$.

In this case, it is possible to obtain the same effects as in the item 1.

[3] <JBS Diode Having a Reduced Area Ratio of the pn Junction Region to the Schottky Junction Region>

A junction barrier Schottky diode (1) has a first semiconductor region (3) of a first conductivity type on a semiconductor substrate (2). In the first semiconductor region, a plurality of second semiconductor regions (4) of a second conductivity type are formed in a plurality of rows and columns, so that pn junction regions are formed at predetermined distances between the plurality of second semiconductor regions and the first semiconductor region. A third semiconductor region (5) of the first conductivity type is formed between the second semiconductor regions in order to form a Schottky junction region. An electrode (6) is formed on the second and third semiconductor regions. Each of the second semiconductor regions has a quadrangular shape having a side with a length b in plan view from the electrode. Assuming that an extendable size of a depletion layer from an edge of the second semiconductor region when a predetermined reverse voltage is applied is a in the plan view, a distance between adjacent second semiconductor regions in the one side direction is a√2, a distance between adjacent second semiconductor regions in a direction crossing the one side direction is a+a/√2, and an amount of shift d between adjacent second semiconductor regions in adjacent columns extending in the one side direction of the second semiconductor region satisfies a relationship of a/√2≤d≤b+a/√2.

In this case, the above relationship assumes that the depletion layers of the adjacent second semiconductor regions are connected to each other when a reverse voltage is applied thereto and that the Y-direction distance between the second semiconductor regions in the different columns is larger than the X-direction distance between the second semiconductor regions in each column. Therefore, since it is possible to guarantee the connection between the depletion layers when a reverse voltage is applied thereto, it is possible to reduce the area ratio of the second semiconductor region to the third semiconductor region, compared with a case where the second semiconductor regions are arranged in a simple lattice shape or a case where the second semiconductor regions are arranged in a staggered shape at equal distances in the XY directions. The above arrangement relationship between the second semiconductor region serving as a pn junction region to the third semiconductor region serving as a Schottky junction region is suitable for increasing the forward current while reducing the reverse current.

[4] <Appropriate Shape of the Second Semiconductor Region>

In anyone of the items 1 to 3, the second semiconductor region is any of a square, a rectangle, and a parallelogram.

In this case, the same effects as described above are obtained for the shape of the second semiconductor region that is any of a square, a rectangle, and a parallelogram.

[5] <Appropriate Arrangement of the Second Semiconductor Region>

In the item 3, the amount of shift d between adjacent second semiconductor regions in the one side direction is b/2.

This is suitable for reducing the error in the characteristics in terms of the uniformity of the arrangement of the second and third semiconductor regions formed in the first semiconductor region.

[6] <Predetermined Reverse Voltage is an Allowable Reverse Voltage>

In the item 3, the predetermined reverse voltage is an allowable reverse voltage.

In this case, it is possible to guarantee the expected performance for use at the allowable voltage.

[7] <Method for Manufacturing a JBS Diode Having a Reduced Area Ratio of the pn Junction Region to the Schottky Junction Region>

A method for manufacturing a junction barrier Schottky diode (1) includes: a step of forming a first semiconductor region (3) of a first conductivity type on a semiconductor substrate (2); a step of forming a plurality of second semiconductor regions (4) of a second conductivity type in a staggered arrangement in the first semiconductor region, pn junction regions being formed at predetermined distances between the plurality of second semiconductor regions and the first semiconductor region; a step of forming a third semiconductor region (5) of the first conductivity type on the first semiconductor region between the second semiconductor regions in order to form a Schottky junction region; and a step of forming an electrode (6) on the second and third semiconductor regions. Each of the second semiconductor regions is formed in a quadrangular shape in plan view from the electrode. The second semiconductor regions arranged at equal distances in an X direction are formed in a plurality of columns in a Y direction. An amount of shift (d) between adjacent columns in the X direction is set such that a Y-direction distance (c') between the second semiconductor regions in the different columns is larger than an X-direction distance (c) between the second semiconductor regions in each of the columns.

In this case, since the amount of shift between adjacent columns in the X direction in the staggered arrangement of the second semiconductor regions is set such that the Y-direction distance between the second semiconductor regions in the different columns is larger than the X-direction distance between the second semiconductor regions in each column, it is possible to guarantee the connection between the depletion layers when a reverse voltage is applied thereto. Therefore, compared with a case where the second semiconductor regions are arranged in a simple lattice shape or a case where the second semiconductor regions are arranged in a staggered shape at equal distances in the XY directions, it is possible to reduce the area ratio of the second semiconductor region to the third semiconductor region. The above method of the staggered arrangement of the second semiconductor regions is suitable for manufacturing the junction barrier Schottky diode to increase the forward current while reducing the reverse current.

[8] <Method for Manufacturing a JBS Diode Having a Reduced Area Ratio of the pn Junction Region to the Schottky Junction Region>

A method for manufacturing a junction barrier Schottky diode (1) includes: a step of forming a first semiconductor region (3) of a first conductivity type on a semiconductor substrate (2); a step of forming a plurality of second semiconductor regions (4) of a second conductivity type in a plurality of rows and columns in the first semiconductor region, pn junction regions being formed at predetermined distances between the plurality of second semiconductor regions and the first semiconductor region; a step of forming a third semiconductor region (5) of the first conductivity type on the first semiconductor region between the second semiconductor regions in order to form a Schottky junction region; and a step of forming an electrode (6) on the second and third semiconductor regions so as to overlap each other. Each of the second semiconductor regions has a quadrangular shape having a side with a length b in plan view from the electrode. Assuming that a distance between adjacent second semiconductor regions in the one side direction is c and a distance between adjacent second semiconductor regions in a direction crossing the one side direction is larger than the distance c, an amount of shift d between adjacent second semiconductor regions in adjacent columns extending in the one side direction of the second semiconductor region satisfies a relationship of c/2≤d≤b+c/2.

In this case, it is possible to obtain the same effects as in the item 7.

[9] <Method for Manufacturing a JBS Diode Having a Reduced Area Ratio of the pn Junction Region to the Schottky Junction Region>

A method for manufacturing a junction barrier Schottky diode (1) includes: a step of forming a first semiconductor region (3) of a first conductivity type on a semiconductor substrate (2); a step of forming a plurality of second semiconductor regions (4) of a second conductivity type in a plurality of rows and columns in the first semiconductor region, pn junction regions being formed at predetermined distances between the plurality of second semiconductor regions and the first semiconductor region; a step of forming a third semiconductor region (5) of the first conductivity type on the first semiconductor region between the second semiconductor regions in order to form a Schottky junction region; and a step of forming an electrode (6) on the second and third semiconductor regions. Each of the second semiconductor regions has a quadrangular shape having a side with a length b in plan view from the electrode. Assuming that an extendable size of a depletion layer from an edge of the second semiconductor region when a predetermined reverse voltage is applied is a in the plan view, a distance between adjacent second semiconductor regions in the one side direction is $a\sqrt{2}$, a distance between adjacent second semiconductor regions in a direction crossing the one side direction is $a+a/\sqrt{2}$, and an amount of shift d between adjacent second semiconductor regions in adjacent columns extending in the one side direction of the second semiconductor region satisfies a relationship of $a/\sqrt{2} \leq d \leq b+a/\sqrt{2}$.

In this case, the above relationship assumes that the depletion layers of the adjacent second semiconductor regions are connected to each other when a reverse voltage is applied thereto and that the Y-direction distance between the second semiconductor regions in the different columns is larger than the X-direction distance between the second semiconductor regions in each column. Therefore, since it is possible to guarantee the connection between the depletion layers when a reverse voltage is applied thereto, it is possible to reduce the area ratio of the second semiconductor region to the third semiconductor region, compared with a case where the second semiconductor regions are arranged in a simple lattice shape or a case where the second semiconductor regions are arranged in a staggered shape at equal distances in the XY directions. The above arrangement relationship between the second semiconductor region serving as a pn junction region to the third semiconductor region serving as a Schottky junction region is suitable for manufacturing the junction barrier Schottky diode to increase the forward current while reducing the reverse current.

[10] <Appropriate Shape of the Second Semiconductor Region>

In anyone of the items 7 to 9, the second semiconductor region is any of a square, a rectangle, and a parallelogram.

In this case, the same effects as described above are obtained in the shape of the second semiconductor region that is any of a square, a rectangle, and a parallelogram.

[11] <Appropriate Arrangement of the Second Semiconductor Region>

In the item 9, the amount of shift d between adjacent second semiconductor regions in the one side direction is b/2.

This is suitable for reducing the error in the characteristics in terms of the uniformity of the arrangement of the second and third semiconductor regions formed in the first semiconductor region.

[12] <Predetermined Reverse Voltage is an Allowable Reverse Voltage>

In the item 9, the predetermined reverse voltage is an allowable reverse voltage.

In this case, it is possible to guarantee the expected performance for use at the allowable voltage.

2. Further Detailed Description of the Embodiments

An embodiment will be further described in detail.

Figure 2:
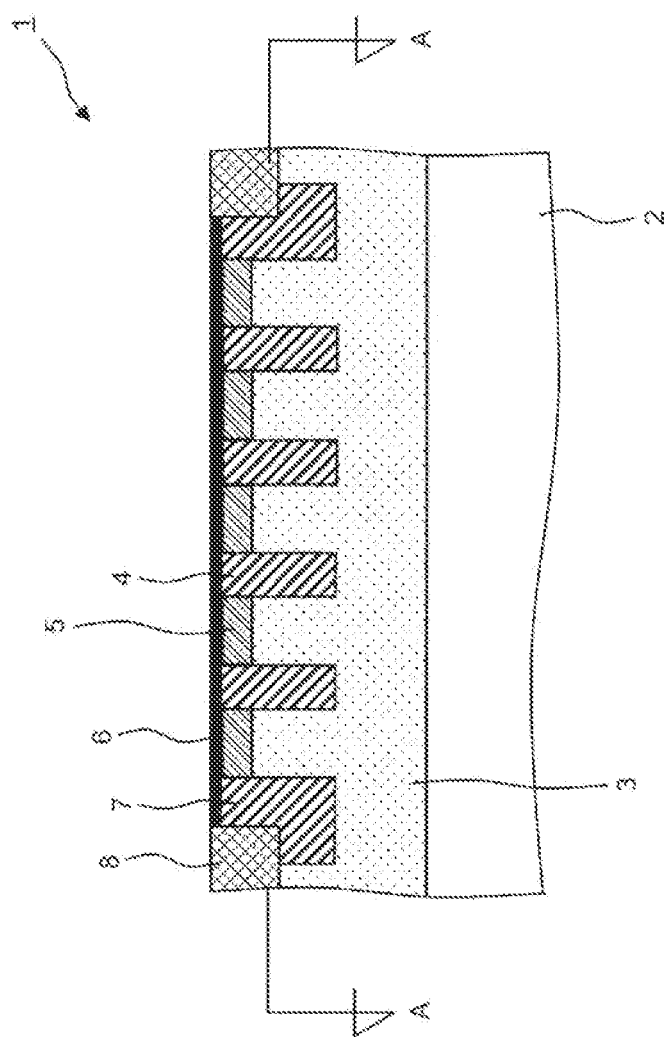
FIG. 2 is a cross-sectional view illustrating the longitudinal sectional structure of an anode portion of a JBS diode.
Figure 3:
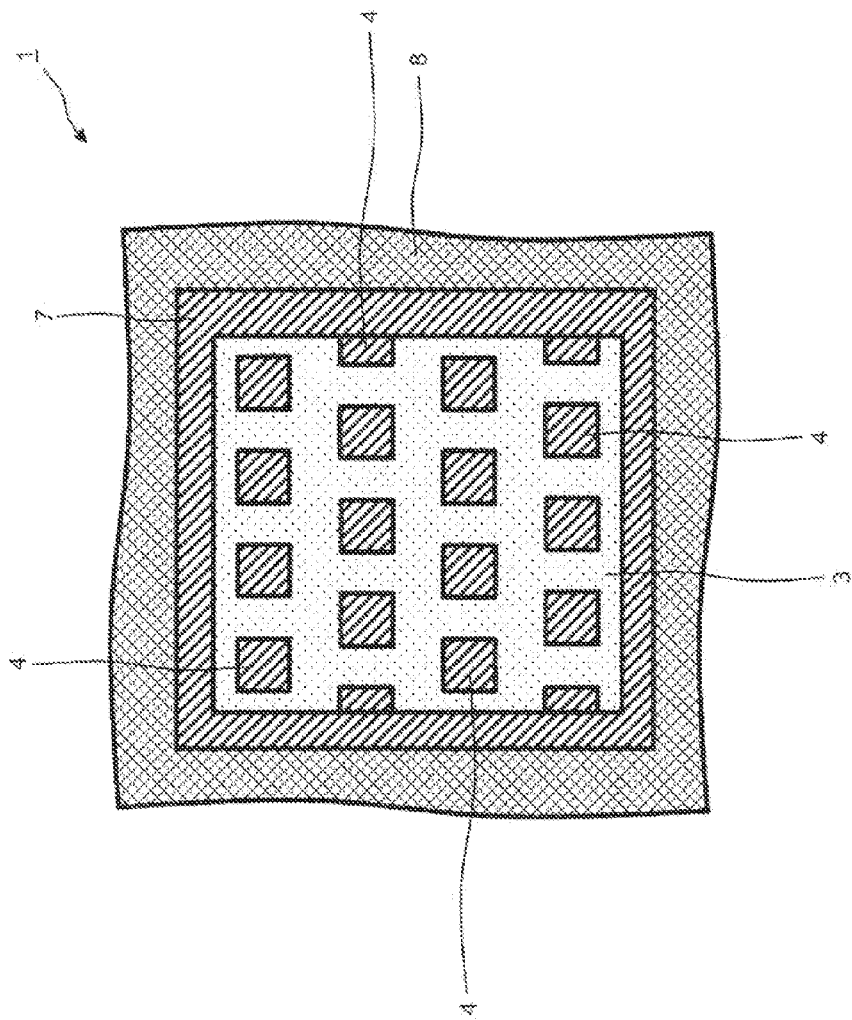
FIG. 3 is a cross-sectional view illustrating the A-A plane cross-sectional structure of FIG. 2.

FIG. 2 illustrates a longitudinal sectional structure of an anode portion of a JBS diode, and FIG. 3 illustrates a cross-sectional structure of the A-A plane of FIG. 2. Although not particularly limited, the JBS diode shown in the diagram is formed on the p-type semiconductor substrate using CMOS integrated circuit manufacturing technology.

Although not particularly limited, a JBS diode 1 is formed in an n-type semiconductor region (first semiconductor region) 3, which has an outer peripheral portion that is surrounded by an element isolation region 8 as an element isolation insulating layer, on a p-type semiconductor substrate 2. In the n-type semiconductor region 3 inside the element isolation region 8, a guard ring 7 is formed on its outer edge. A plurality of p-type semiconductor regions (second semiconductor regions) 4 formed by diffusing p-type impurities and a plurality of n-type semiconductor regions (third semiconductor region) 5 formed by diffusing n-type impurities are provided inside the guard ring 7. The p-type semiconductor regions 4 are arranged in island shapes at predetermined distances therebetween in the n-type semiconductor region 5 in plan view. On the p-type semiconductor regions 4 and the n-type semiconductor regions 5, an anode electrode 6 made of silicide is formed. The anode electrode 6 is in ohmic contact with the p-type semiconductor region 4, and is in Schottky contact with the n-type semiconductor region 5. Although not particularly limited, a cathode may be formed on the back side of the semiconductor substrate or outside the guard ring of the first semiconductor region.

The n-type semiconductor region 3 is formed by ion implantation and high-temperature heat treatment, for example. The concentration of n-type impurities is $10^{15}$ $cm^{-3}$ to $10^{17}$ $cm^{-3}$, for example. The p-type semiconductor region 4 is formed by ion implantation and high-temperature heat treatment, for example. The concentration of p-type impurities is $10^{17}$ $cm^{-3}$ to $10^{19}$ $cm^{-3}$, for example. The n-type semiconductor region 5 is formed by ion implantation and high-temperature heat treatment, for example. The concentration of n-type impurities is $10^{18}$ $cm^{-3}$ to $10^{20}$ $cm^{-3}$, for example. For example, phosphorus is used as the n-type impurity, and boron is used as the p-type impurity.

The anode electrode 6 is formed by depositing a metal film, such as titanium, cobalt, or nickel, using a sputtering method and performing heat treatment using a lamp annealing method, for example.

Figure 25:
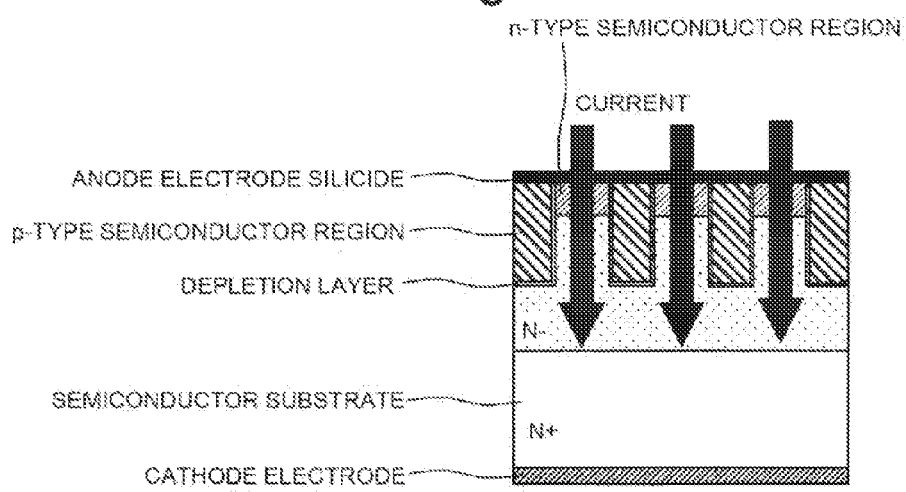
FIG. 25 is an explanatory diagram showing the schematic configuration of a vertical cross-section of the JBS diode when a forward voltage is applied thereto.
Figure 26:
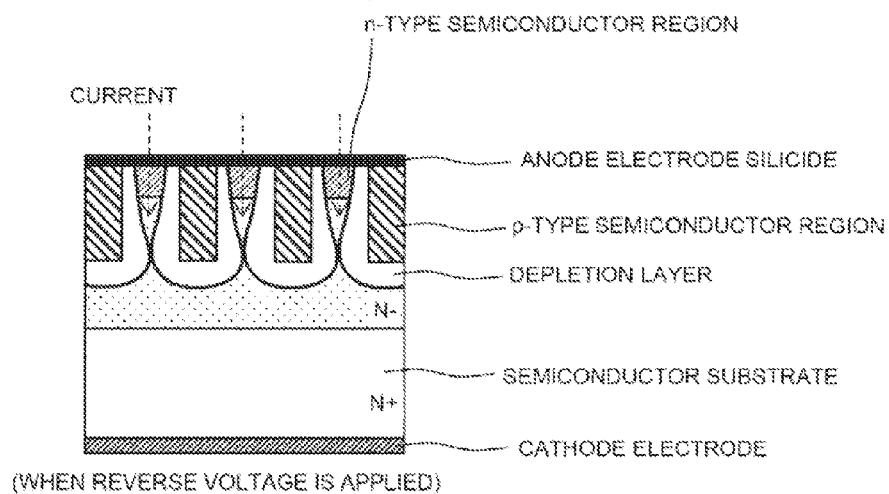
FIG. 26 is an explanatory diagram showing the schematic configuration of a vertical cross-section of the JBS diode when a reverse voltage is applied thereto.

As described in FIG. 25, a forward current mainly flows through a Schottky barrier formed on the interface between the anode electrode 6 and the n-type semiconductor region 5. On the other hand, when a reverse voltage is applied to the JBS diode 1, a depletion layer spreading from the pn junction formed at the interface between the p-type semiconductor region 4 and the n-type semiconductor region 3 spreads to the surface side of the n-type semiconductor region 3 in the same manner as described in FIG. 26. Due to this depletion layer being provided, the reverse current (leakage current) is suppressed.

As shown in the plan view of FIG. 3, the p-type semiconductor regions 4 are arranged in a staggered shape. The staggered arrangement will be described in detail below.

Figure 1:
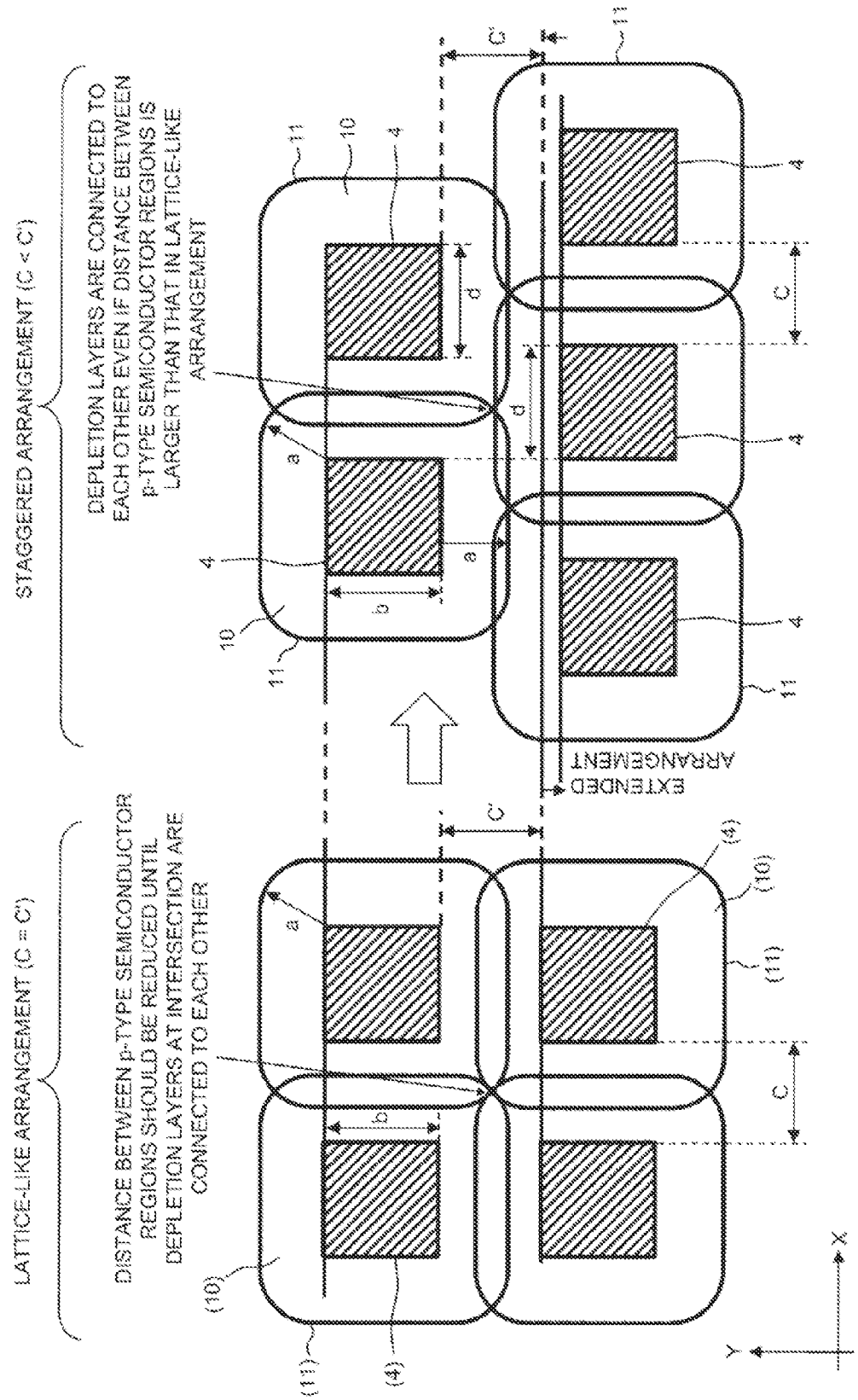
FIG. 1 is an explanatory diagram showing the staggered arrangement of p-type semiconductor regions compared with a simple lattice-like arrangement.
Figure 4:
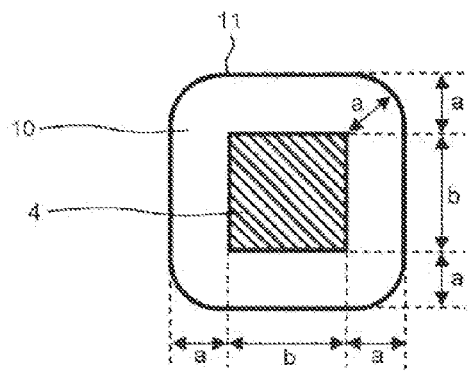
FIG. 4 is an explanatory diagram showing an example of the dimensional relationship of one p-type semiconductor region.

FIG. 1 shows the staggered arrangement of the p-type semiconductor regions 4 in comparison with a simple lattice-like arrangement. Here, one p-type semiconductor region 4 is a square that is an example of the quadrangular shape in plan view. As also illustrated in FIG. 4, the length of one side of one p-type semiconductor region 4 is set to b, and the extendable size of the depletion layer from the edge of the p-type semiconductor region 4 when a predetermined reverse voltage is applied is set to a in plan view. In this case, 10 indicates a depletion layer of one p-type semiconductor region 4 in plan view, and 11 indicates the boundary of the depletion layer.

In FIG. 1, in the simple lattice-like arrangement shown as a comparative example, a distance between the p-type semiconductor regions 4 should be reduced as illustrated in the drawing until depletion layers at the intersection of the four p-type semiconductor regions 4 adjacent to each other in X and Y directions are connected to each other while maintaining a distance c between the adjacent p-type semiconductor regions 4 in the X direction and a distance c' between the adjacent p-type semiconductor regions 4 in the Y direction equal (c=c'). In contrast, in the staggered arrangement shown in FIG. 1, not only is the column of the p-type semiconductor regions 4 in the lattice-like arrangement shifted, but also a column distance c' between the p-type semiconductor regions 4 is increased. In this case, an amount of shift d and the column distance c' in the X direction are determined so as not to cause a discontinuity in the connection between the depletion layers of the adjacent p-type semiconductor regions 4. That is, the amount of shift d between adjacent columns in the X direction is set such that the X-direction distance c between the p-type semiconductor regions 4 in each column is shorter than the Y-direction distance c' between the p-type semiconductor regions 4 in adjacent columns, thereby preventing a discontinuity in the connection between the depletion layers of the adjacent p-type semiconductor regions 4. The area of the n-type semiconductor region 5 in plan view in the staggered arrangement shown in FIG. 1 is larger than that in the lattice-like arrangement shown in FIG. 1. In other words, it is possible to reduce the area ratio of the p-type semiconductor region 4 to the n-type semiconductor region 5. Accordingly, the above staggered arrangement shown in FIG. 1 for the p-type semiconductor region 4 is suitable for increasing the forward current while reducing the reverse current, compared with the lattice-like arrangement shown in FIG. 1.

The specific relationship of the sizes c, c', and d will be described.

Figure 5:
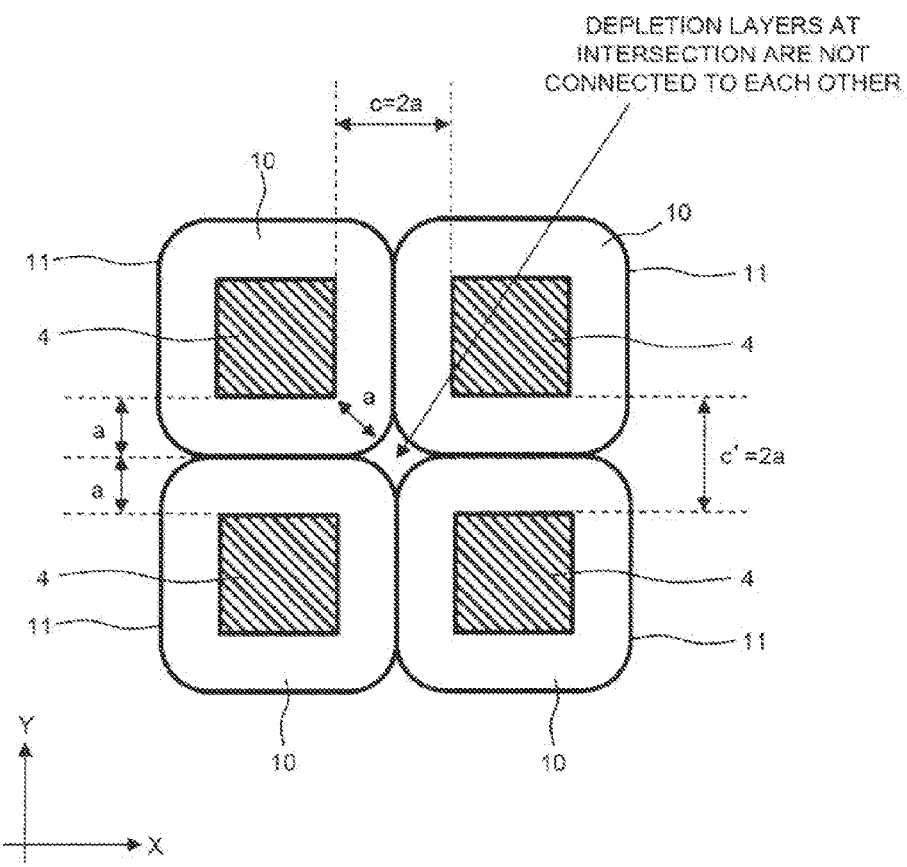
FIG. 5 is an explanatory diagram illustrating an arrangement when p-type semiconductor regions are arranged in a lattice shape under the conditions of c=c'=2a (where, c is a distance between the p-type semiconductor regions in the X direction and c' is a distance between the p-type semiconductor regions in the Y direction.)

In the case of a lattice-like arrangement in which the X-direction distance c and the Y-direction distance c' between the p-type semiconductor regions 4 are set to be c=c'=2a as illustrated in FIG. 5, the adjacent depletion layers 10 are not connected to each other at the intersection.

Figure 6:
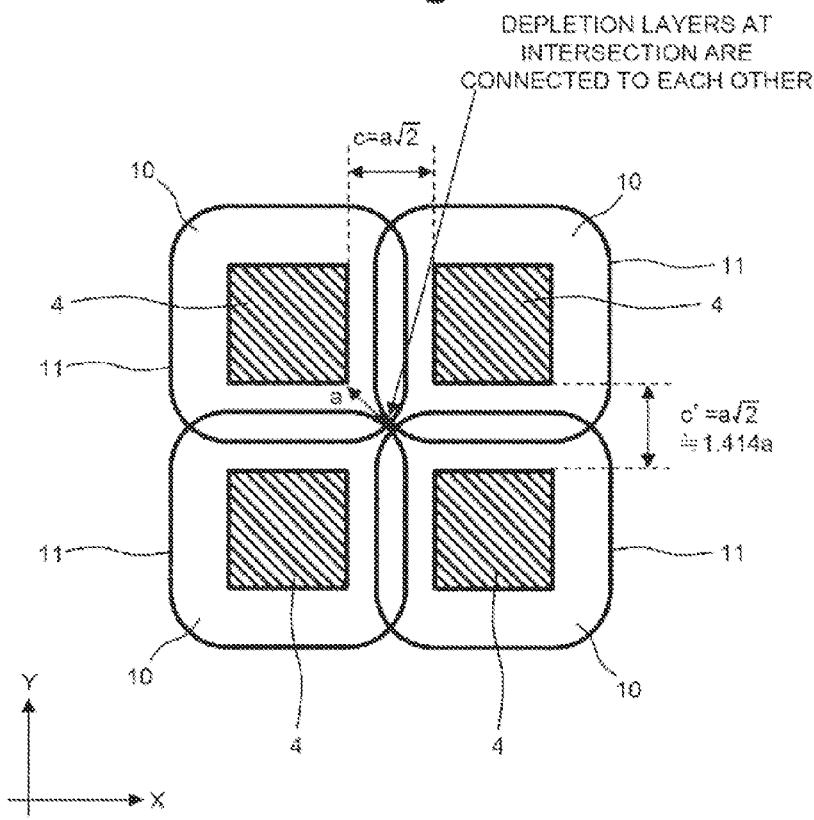
FIG. 6 is an explanatory diagram illustrating an arrangement when $c=c'=a\sqrt{2}$ is set so as to connect adjacent depletion layers to each other in a lattice-like arrangement in which c=c' is satisfied.

In order to connect the adjacent depletion layers 10 to each other in the lattice-like arrangement in which c=c' is satisfied, it is desired to set c=c'=a$\sqrt{2}$≈1.414a as illustrated in FIG. 6.

Figure 7:
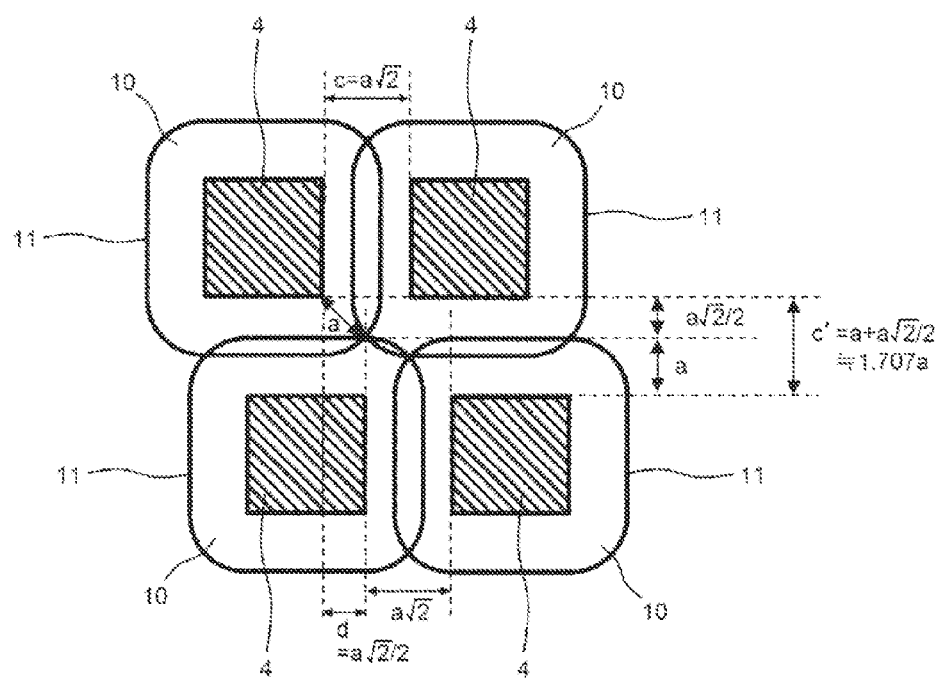
FIG. 7 is an explanatory diagram showing the conditions of the lower limit, at which the depletion layers are connected to each other even if the distance c' between the p-type semiconductor regions is set to be larger than in the lattice-like arrangement shown in FIG. 6, when the columns of the p-type semiconductor regions are shifted from each other in the X direction so that the p-type semiconductor regions are arranged in a staggered shape.
Figure 8:
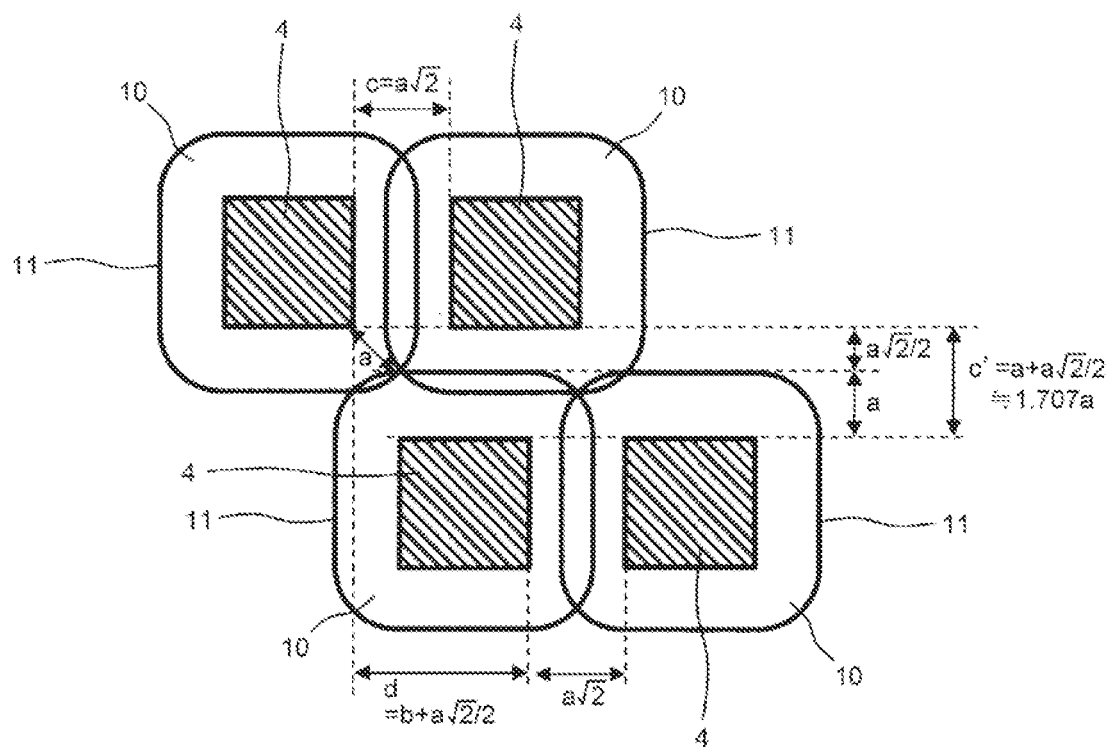
FIG. 8 is an explanatory diagram showing the conditions of the upper limit, at which the depletion layers are connected to each other even if the distance c' between the p-type semiconductor regions is set to be larger than in the lattice-like arrangement shown in FIG. 6, when the columns of the p-type semiconductor regions are shifted from each other in the X direction so that the p-type semiconductor regions are arranged in a staggered shape.

As illustrated in FIGS. 7 and 8, in the case of a staggered arrangement in which columns of the p-type semiconductor regions 4 are shifted from each other in the X direction, the depletion layers 10 are connected to each other even if the distance c' between the p-type semiconductor regions 4 is set to be larger than in the lattice-like arrangement shown in FIG. 6. Assuming that the amount of shift of the lower p-type semiconductor region 4 with respect to the column of the upper p-type semiconductor region 4 is d, in the range of d=a$\sqrt{2}$/2 shown in FIG. 7 to d=b+a$\sqrt{2}$/2 shown in FIG. 8 in the case of c=a$\sqrt{2}$, depletion layers of the adjacent p-type semiconductor regions 4 are connected to each other even if the distance c' between the p-type semiconductor regions 4 in the Y direction is increased to c'=a+a$\sqrt{2}$/2≈1.707a. Compared with the case shown in FIG. 6, the distance c' in the Y direction can be increased to approximately 1.2 times. This means that, as represented in FIGS. 7 and 8, c≤c' can be satisfied if the range of d is c/2≤d≤b+c/2 (c=a$\sqrt{2}$/2). Accordingly, since it is possible to reduce the area ratio of the p-type semiconductor region to the anode area without an increase of the reverse current, it is possible to improve the forward current characteristics.

Here, a difference in the area ratio of the p-type semiconductor region to the anode area according to the arrangement form will be described with reference to FIGS. 9 to 11.

Figure 9:
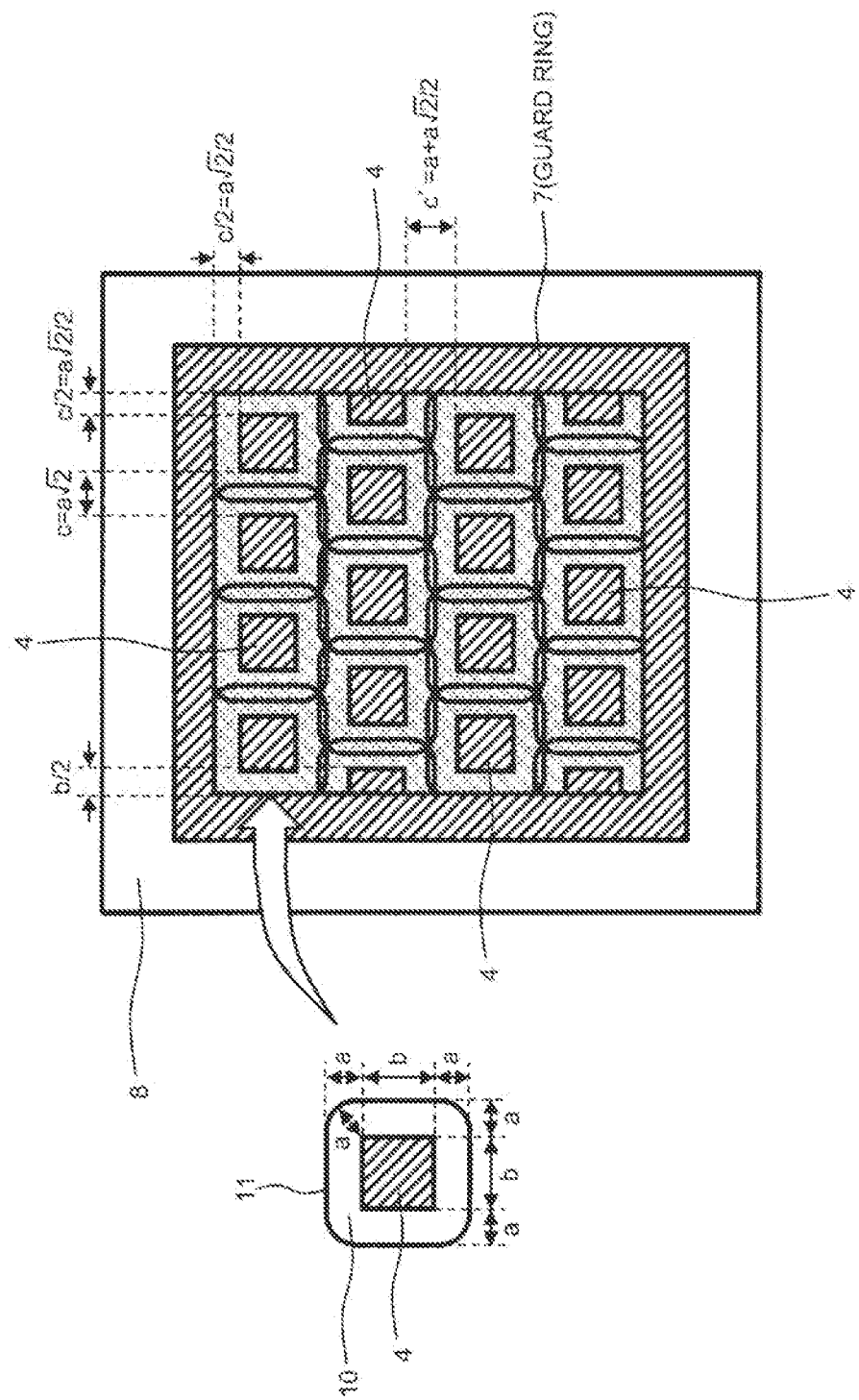
FIG. 9 is a diagram for explaining the area ratio of the p-type semiconductor region to the anode area according to the arrangement form when the p-type semiconductor regions are arranged in the staggered shape including, for example, 4×4 units.

As illustrated in FIG. 9, when the p-type semiconductor regions 4 are arranged in the staggered shape including, for example, 4×4 units, the area Sa of the anode electrode inside the guard ring 7 is as follows.

$$Sa=(4b+4c)\times(4b+3c'+c)$$

$$Sa=4(b+a\sqrt{2})\times(4b+3(a+a\sqrt{2}/2)+a\sqrt{2})$$

The area Sp of the p-type semiconductor region inside the guard ring 7 is Sp=16b$^2$.

The area ratio Sp/Sa of the p-type semiconductor region inside the guard ring 7 is Sp/Sa=16b$^2$/{(b+a$\sqrt{2}$)×(4b+3(a+a$\sqrt{2}$/2)+a$\sqrt{2}$)}. For example, when a=0.5 μm and b=1 μm are assumed, the area ratio Sp/Sa of the p-type semiconductor region 4 is Sp/Sa=32.2%.

Figure 10:
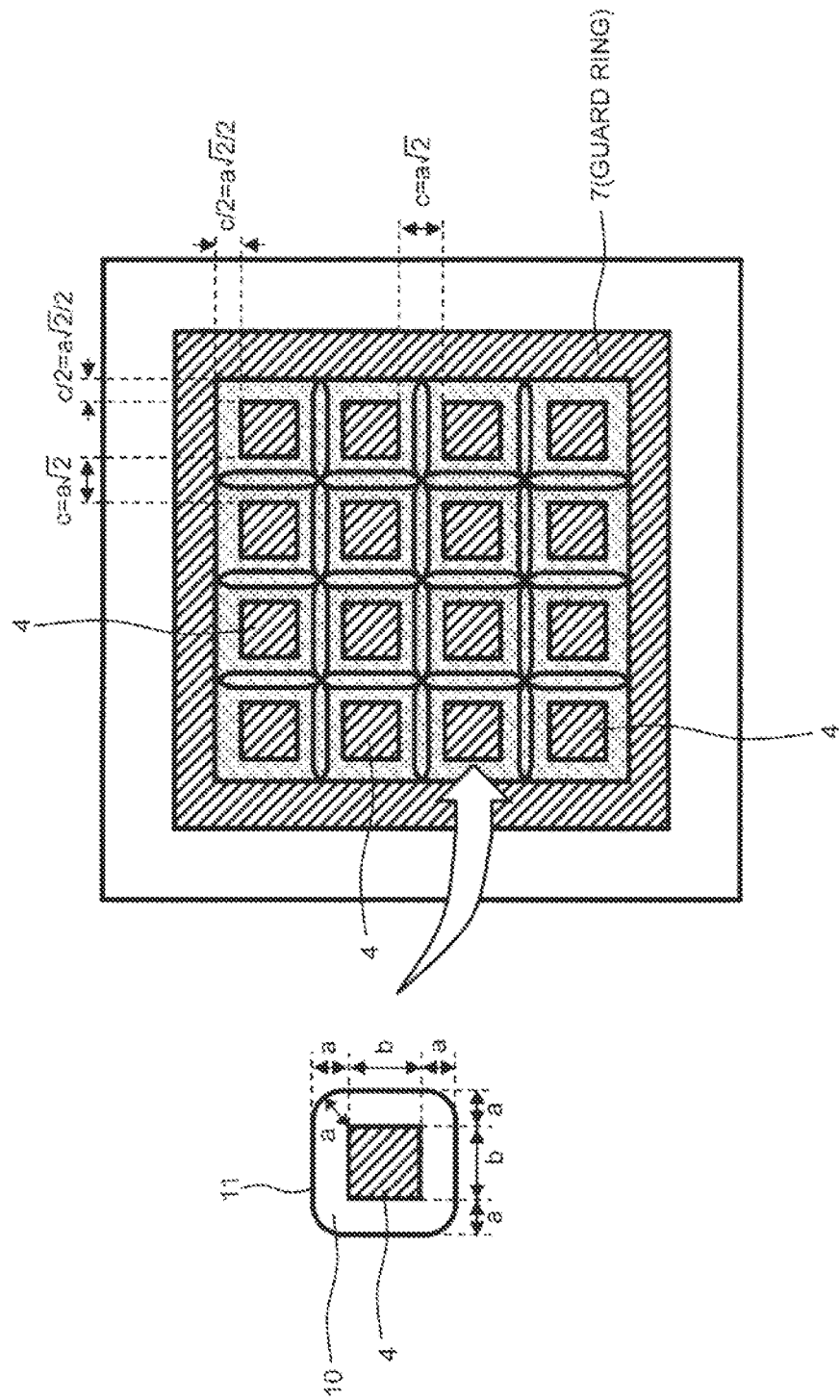
FIG. 10 is a diagram for explaining the area ratio when the p-type semiconductor regions are arranged in the lattice shape of, for example, 4×4 units.

On the other hand, as illustrated in FIG. 10, when the p-type semiconductor regions 4 are arranged in the lattice shape including, for example, 4×4 units, the area Sa of the anode electrode inside the guard ring 7 is as follows.

$$Sa=(4b+4c)^2$$

$$Sa=16(b+a\sqrt{2})^2$$

The area Sp of the p-type semiconductor region inside the guard ring 7 is Sp=16b$^2$.

The area ratio Sp/Sa of the p-type semiconductor region inside the guard ring 7 is Sp/Sa=b$^2$/(b+a$\sqrt{2}$)$^2$. For example, when a=0.5 μm and b=1 μm are assumed, the area ratio Sp/Sa of the p-type semiconductor region 4 is Sp/Sa=34.3%.

Figure 11:
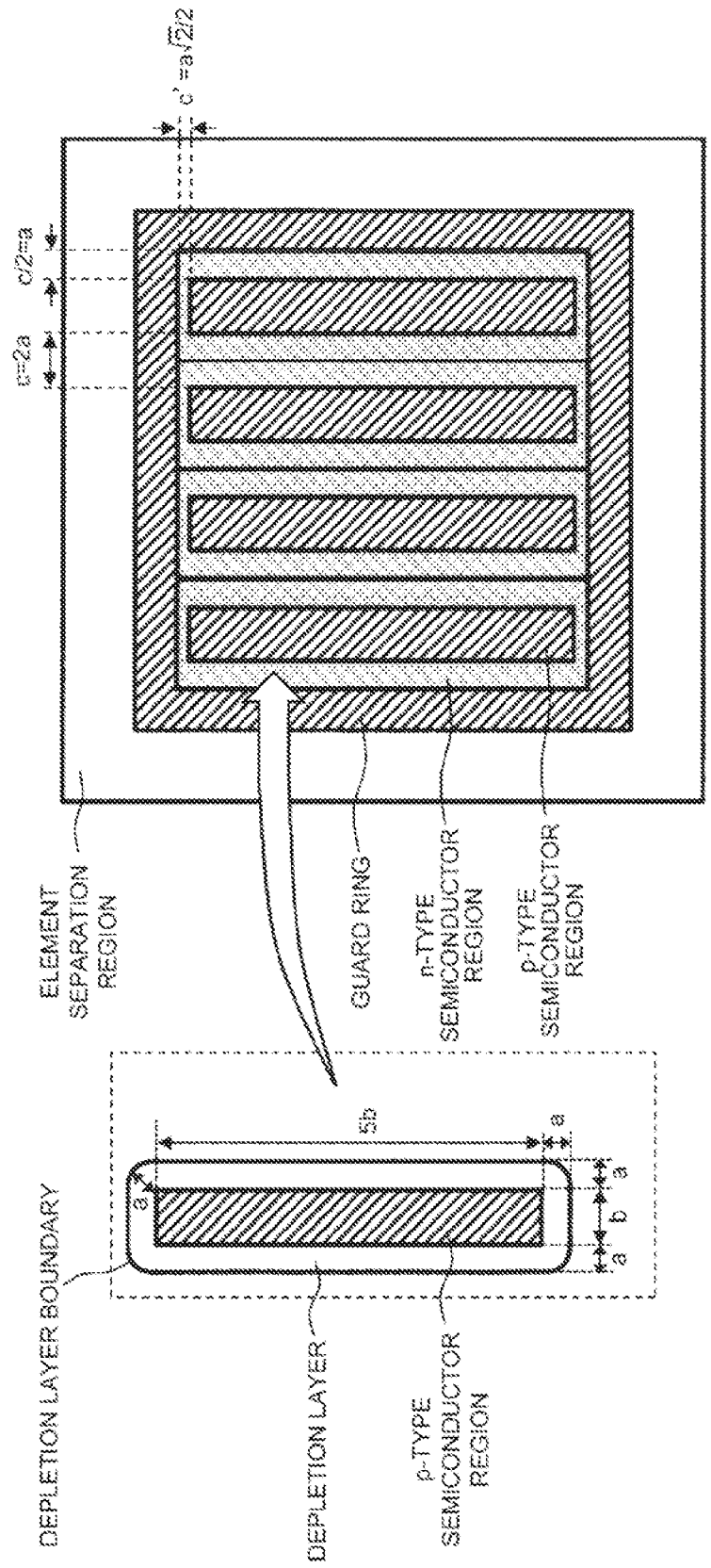
FIG. 11 is a diagram for explaining the area ratio when the p-type semiconductor region has a rectangular shape with a width b and a height 5b and the four p-type semiconductor regions are arranged in the width direction.

On the other hand, as illustrated in FIG. 11, when the p-type semiconductor region 4 has a rectangular shape with a width b and a height 5b and the four p-type semiconductor regions 4 are arranged in the width direction, the area Sa of the anode electrode inside the guard ring is as follows.

$$Sa=(5b+2c')\times(4b+4c)$$

$$Sa=4(5b+a\sqrt{2})\times(b+2a)$$

The area Sp of the p-type semiconductor region inside the guard ring is Sp=20b$^2$.

The area ratio Sp/Sa of the p-type semiconductor region inside the guard ring is Sp/Sa=5b$^2$/{(5b+a$\sqrt{2}$)×(b+2a)}. For example, when a=0.5 μm and b=1 μm are assumed, the area ratio Sp/Sa of the p-type semiconductor region is Sp/Sa=43.8%.

Figure 12:
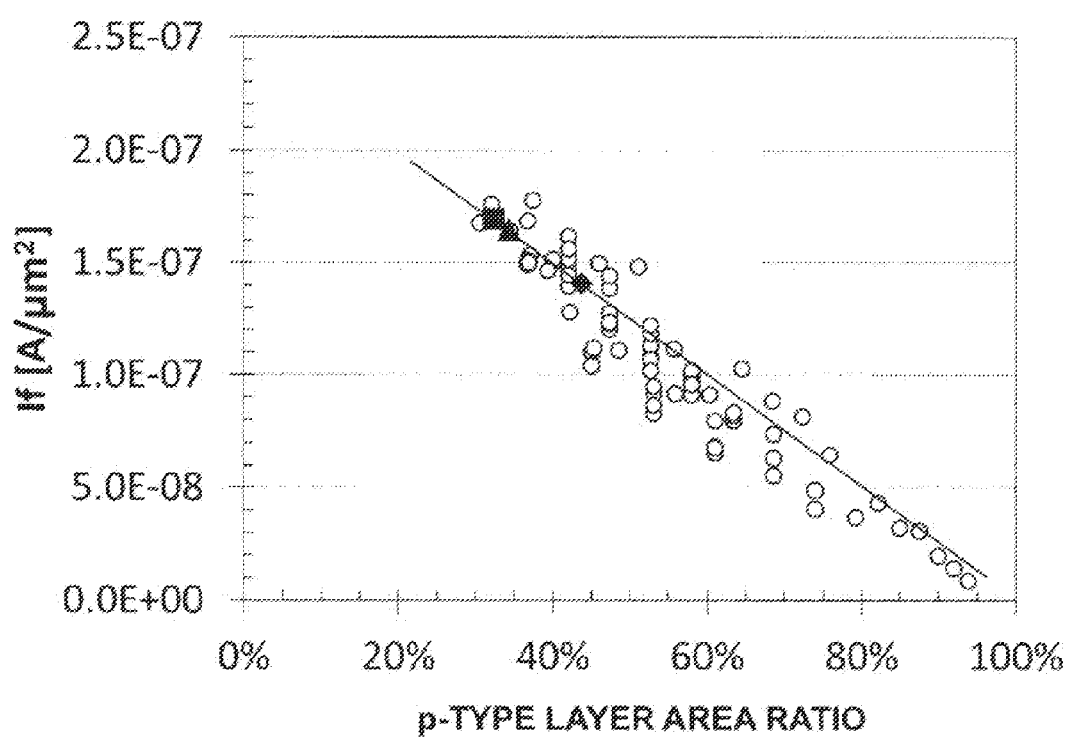
FIG. 12 is a diagram illustrating the relationship between the area ratio of the p-type semiconductor region (p-type layer area ratio) in the anode electrode and a forward current.

FIG. 12 illustrates the relationship between the area ratio of the p-type semiconductor region (p-type layer area ratio) in the anode electrode and a forward current If. As the area ratio decreases, the forward current increases. The value indicated by symbol ■ illustrates an estimated value when the p-type semiconductor regions 4 are arranged in the staggered shape as shown in FIG. 9. The value indicated by symbol ▲ illustrates an estimated value when the p-type semiconductor regions 4 are arranged in the lattice shape as shown in FIG. 10. The value indicated by symbol ♦ illustrates an estimated value when the p-type semiconductor regions are arranged in the rectangular shape as shown in FIG. 11. Values indicated by symbol ○ are a number of actual values of JBS diodes having various structures. Also from FIG. 12, it can be seen that a large forward current is obtained by having a small p-type layer area ratio in the structure in which the p-type semiconductor regions 4 are arranged in the staggered shape as shown in FIG. 9.

FIGS. 13 to 20 illustrate longitudinal sectional structures in the main manufacturing process for manufacturing a JBS diode having a structure in which the p-type semiconductor regions 4 are arranged in the staggered shape.

Although not particularly limited, a manufacturing method for a structure in which the anode electrode and the cathode electrode are located on the same surface will be described as an example herein, in consideration of the fact that wiring at the time of mounting becomes easy if the cathode electrode surface is disposed on the same side as the anode electrode surface when the JBS diode is built into the semiconductor integrated circuit.

Figure 13:
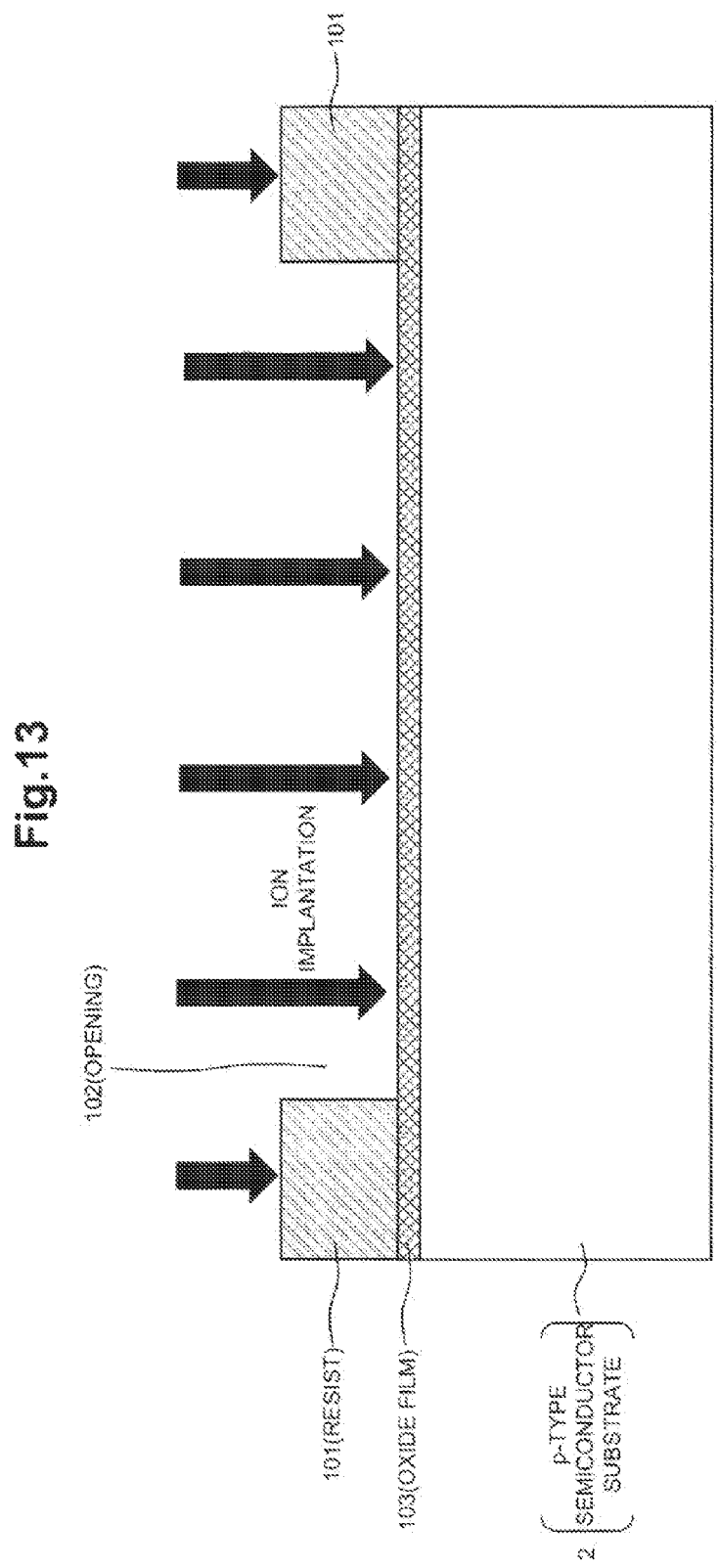
FIG. 13 is a longitudinal sectional diagram illustrating one longitudinal sectional structure in the main manufacturing process for manufacturing a JBS diode having a structure in which the p-type semiconductor regions are arranged in the staggered shape.

First, as illustrated in FIG. 13, an oxide film is formed on the p-type semiconductor substrate 2, and then a resist 101 is patterned by photolithography. The region where the anode electrode and the cathode electrode are formed is an opening 102. 103 is an oxide film.

Figure 14:
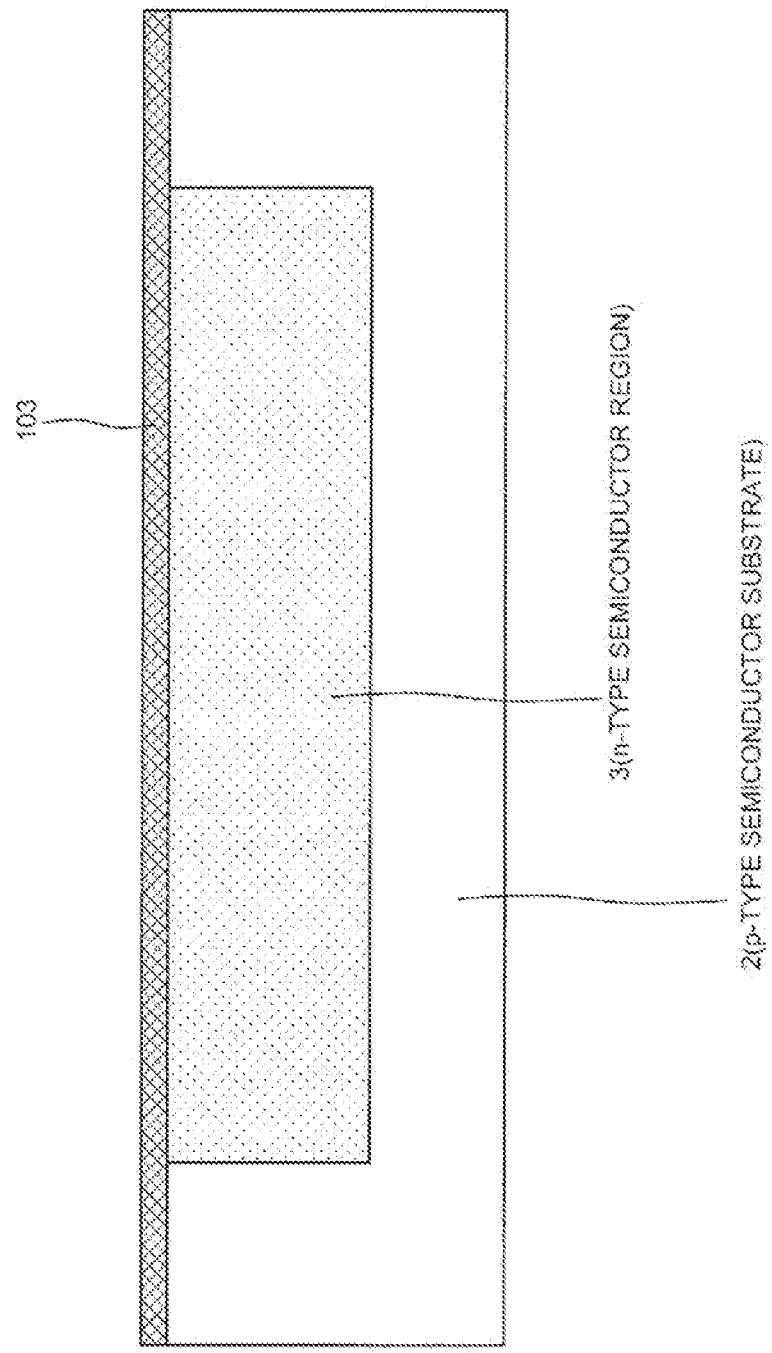
FIG. 14 is a longitudinal sectional diagram illustrating another longitudinal sectional structure in the main manufacturing process for manufacturing a JBS diode having a structure in which the p-type semiconductor regions are arranged in the staggered shape.

Ion implantation is performed on the p-type semiconductor substrate 2 by using the patterned resist 101 as a mask. Then, the resist 101 is removed by ashing or wet etching, and the n-type semiconductor region 3 is formed as illustrated in FIG. 14 by high-temperature heat treatment. In this case, the impurity concentration of the n-type semiconductor region 3 is, for example, $10^{15}$ cm$^{-3}$ to $10^{17}$ cm$^{-3}$, and the impurities are phosphorus.

Figure 15:
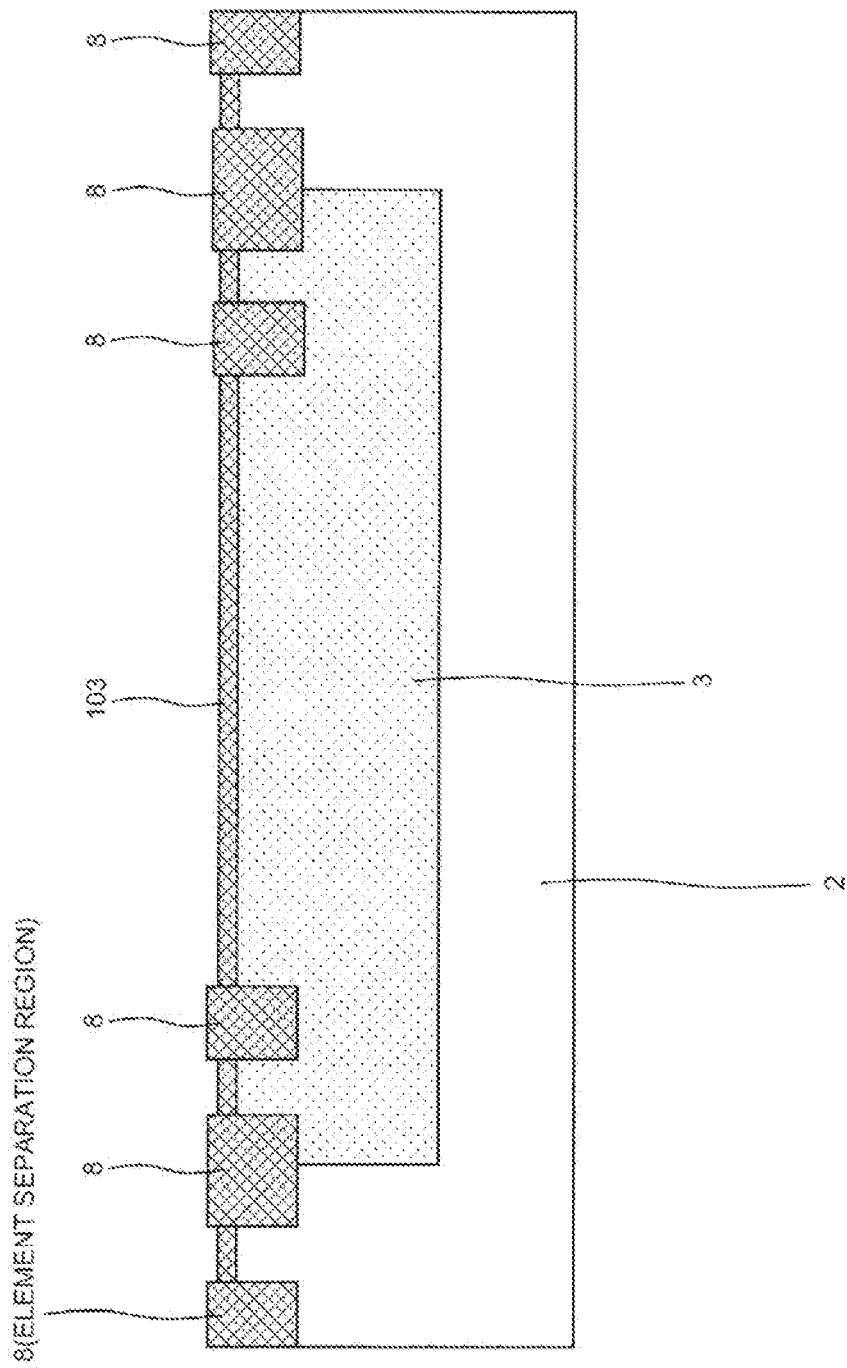
FIG. 15 is a longitudinal sectional diagram illustrating another longitudinal sectional structure in the main manufacturing process for manufacturing a JBS diode having a structure in which the p-type semiconductor regions are arranged in the staggered shape.

Then, the element isolation region 8 is formed as illustrated in FIG. 15. In order to form the element isolation region 8, for example, a nitride film is formed, a resist is patterned by photolithography, and a substrate in the element isolation region is exposed by dry etching. Then, the substrate portion exposed by thermal oxidation treatment is oxidized so as to be thickened, thereby forming an element isolation region. Alternatively, the element isolation region may be formed by etching and removing a substrate in a region, which becomes the element isolation region, of about 300 nm by dry etching and embedding the oxide film. Any of the methods described above can be used, and the nitride film is removed after forming the element isolation region 8. In addition, the n-type semiconductor region 3 may be formed after forming the element isolation region 8.

Figure 16:
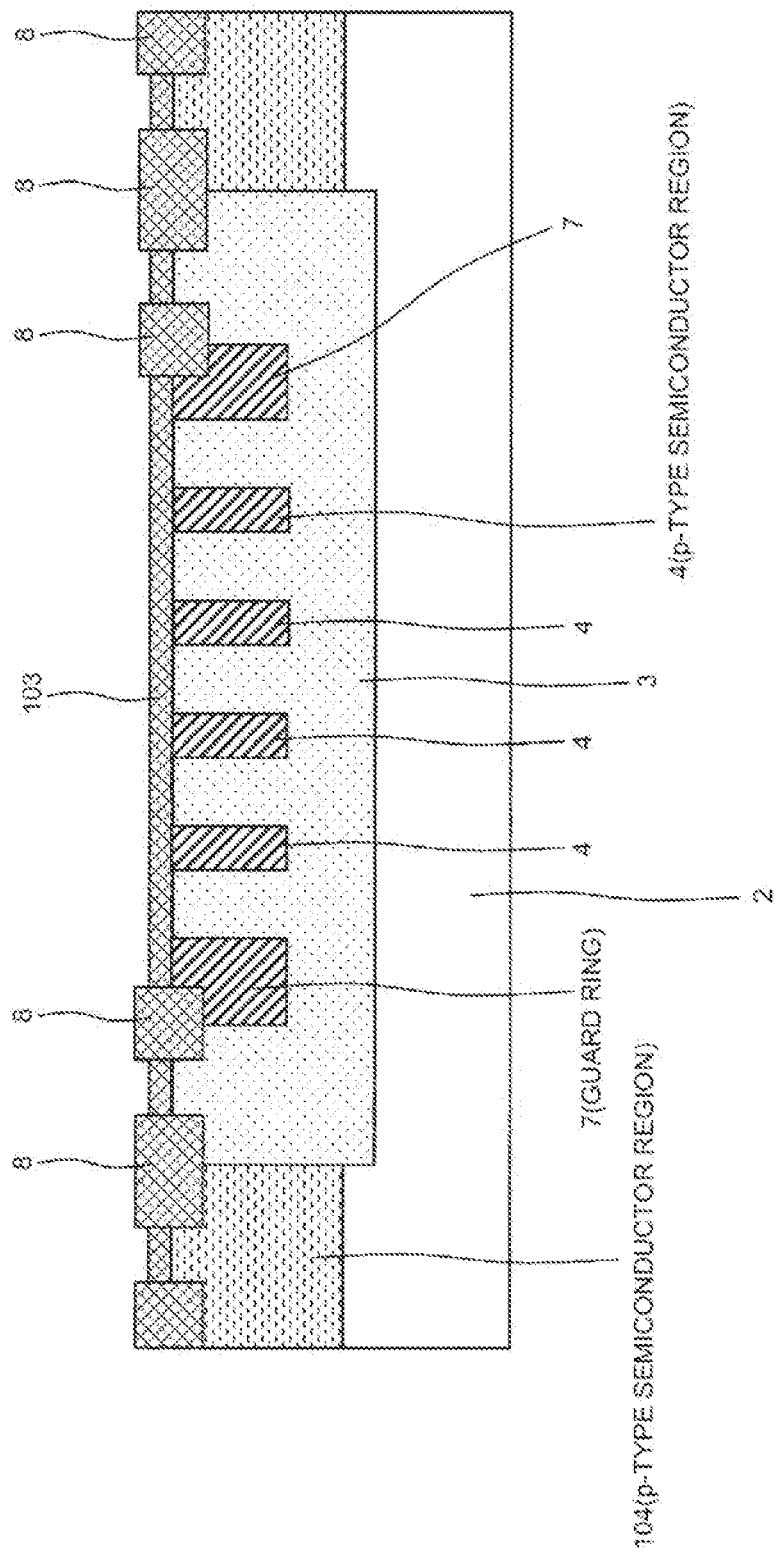
FIG. 16 is a longitudinal sectional diagram illustrating another longitudinal sectional structure in the main manufacturing process for manufacturing a JBS diode having a structure in which the p-type semiconductor regions are arranged in the staggered shape.

Then, resist patterning using photolithography, ion implantation, and resist removal are performed, thereby forming a p-type semiconductor region 104, the guard ring 7, and the p-type semiconductor region 4 as illustrated in FIG. 16. The resist patterning is performed such that the p-type semiconductor regions 4 adjacent to each other are arranged in the staggered shape by setting the distance and the amount of shift between the p-type semiconductor regions 4 as described above. For example, the impurity concentration of the p-type semiconductor region 104 is $10^{19}$ cm$^{-3}$ or less, and the impurity concentration of the p-type semiconductor region 4 is $10^{17}$ cm$^{-3}$ to $10^{19}$ cm$^{-3}$. As the p-type impurities, for example, boron is used.

Figure 17:
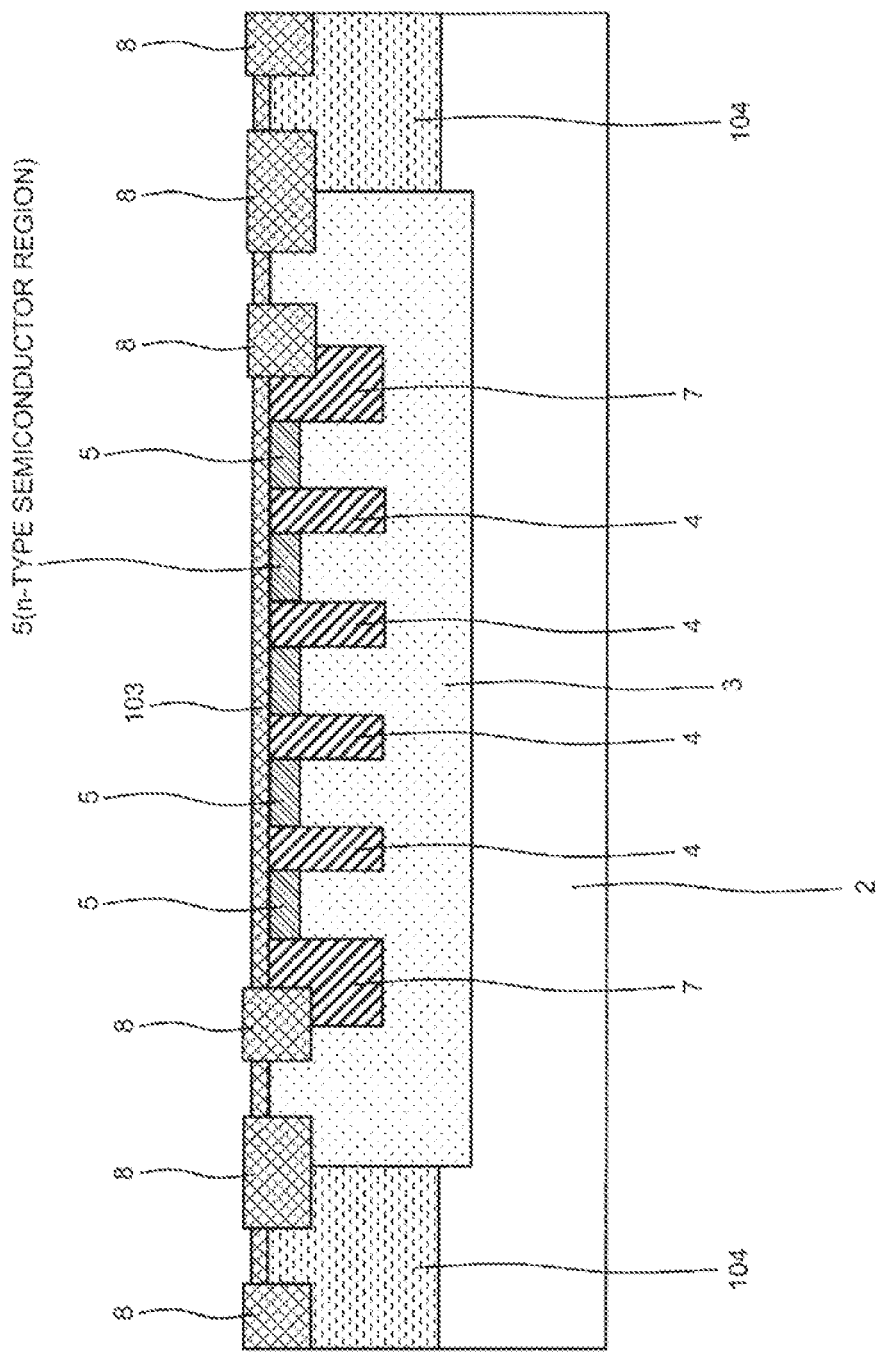
FIG. 17 is a longitudinal sectional diagram illustrating another longitudinal sectional structure in the main manufacturing process for manufacturing a JBS diode having a structure in which the p-type semiconductor regions are arranged in the staggered shape.

Then, as illustrated in FIG. 17, the n-type semiconductor region 5 is formed by performing resist patterning using photolithography, ion implantation, and resist removal. In this case, the impurity concentration of the n-type semiconductor region 5 is $10^{17}$ cm$^{-3}$ to $10^{20}$ cm$^{-3}$, for example. As the n-type impurities, for example, phosphorus or arsenic is used.

In addition to the case where the JBS diode is integrated into a semiconductor integrated circuit, the JBS diode may also be mounted as one on-chip circuit component in a large scale integrated circuit. For example, since the JBS diode has a lower rising voltage than the pn diode, rectification can be performed before latch-up due to the pn junction occurs. Therefore, in order to avoid the latch-up that occurs easily in a transition period at the time of stepping-up/stepping-down of a voltage, the JBS diode may be mounted in the LCD driver or other semiconductor integrated circuits. For example, when other circuits, such as a CMOS logic circuit (not shown), are mounted in the semiconductor integrated circuit, other manufacturing steps, such as formation of a gate oxide film or formation of a gate polysilicon film for the formation of the CMOS circuit and re-formation of a wall, are included. Since various known methods can be used for the above, detailed explanation thereof will be omitted.

Figure 18:
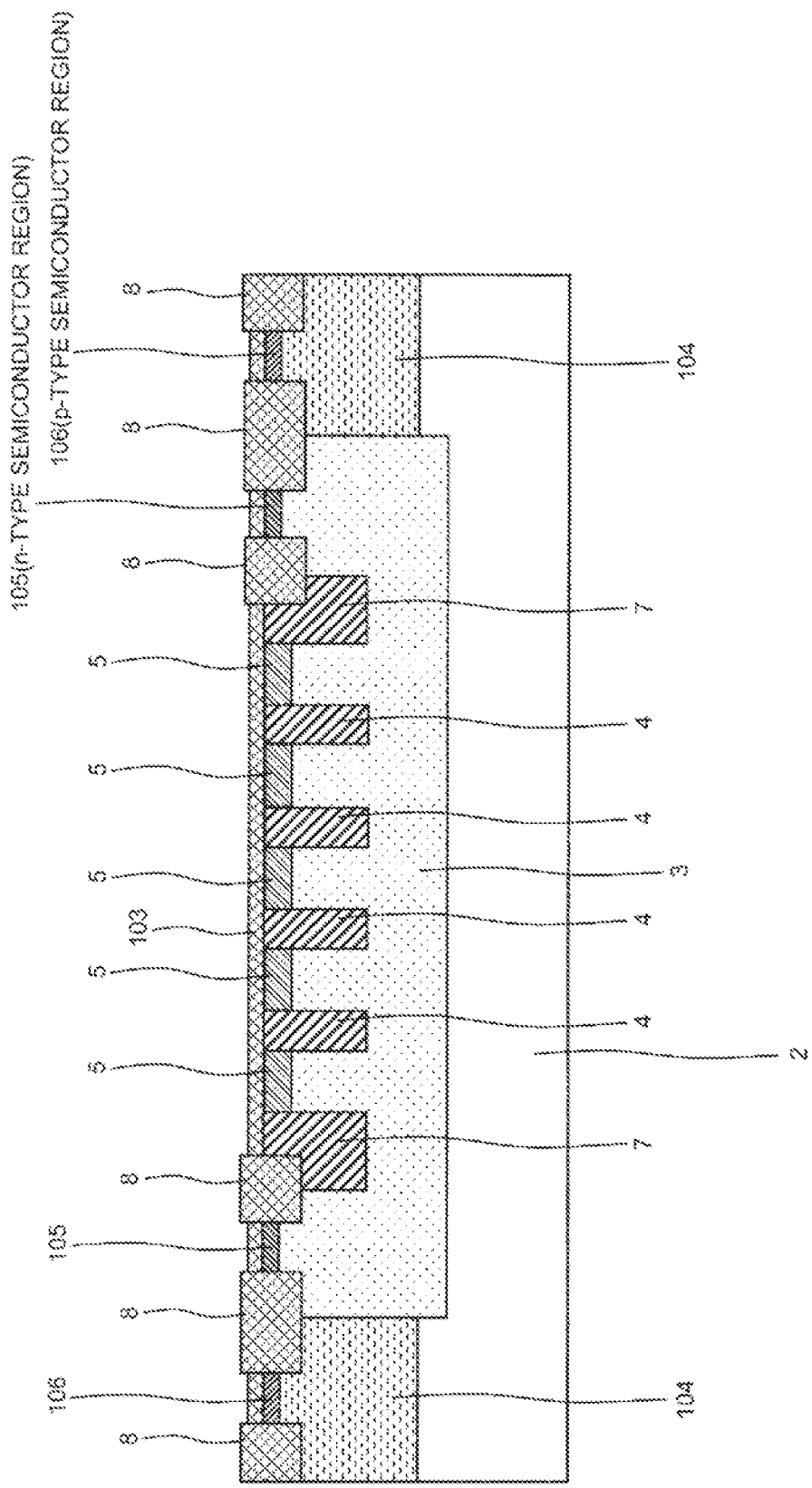
FIG. 18 is a longitudinal sectional diagram illustrating another longitudinal sectional structure in the main manufacturing process for manufacturing a JBS diode having a structure in which the p-type semiconductor regions are arranged in the staggered shape.

Then, as illustrated in FIG. 18, an n-type semiconductor region 105 is formed by performing resist patterning using photolithography, ion implantation, and resist removal, and a p-type semiconductor region 106 is formed using the same process. In this case, the impurity concentration in each of the n-type semiconductor region 105 and the p-type semiconductor region 106 is $10^{20}$ cm$^{-3}$ to $10^{22}$ cm$^{-3}$. After the injection of impurities, heat treatment is performed for activation as needed.

Figure 19:
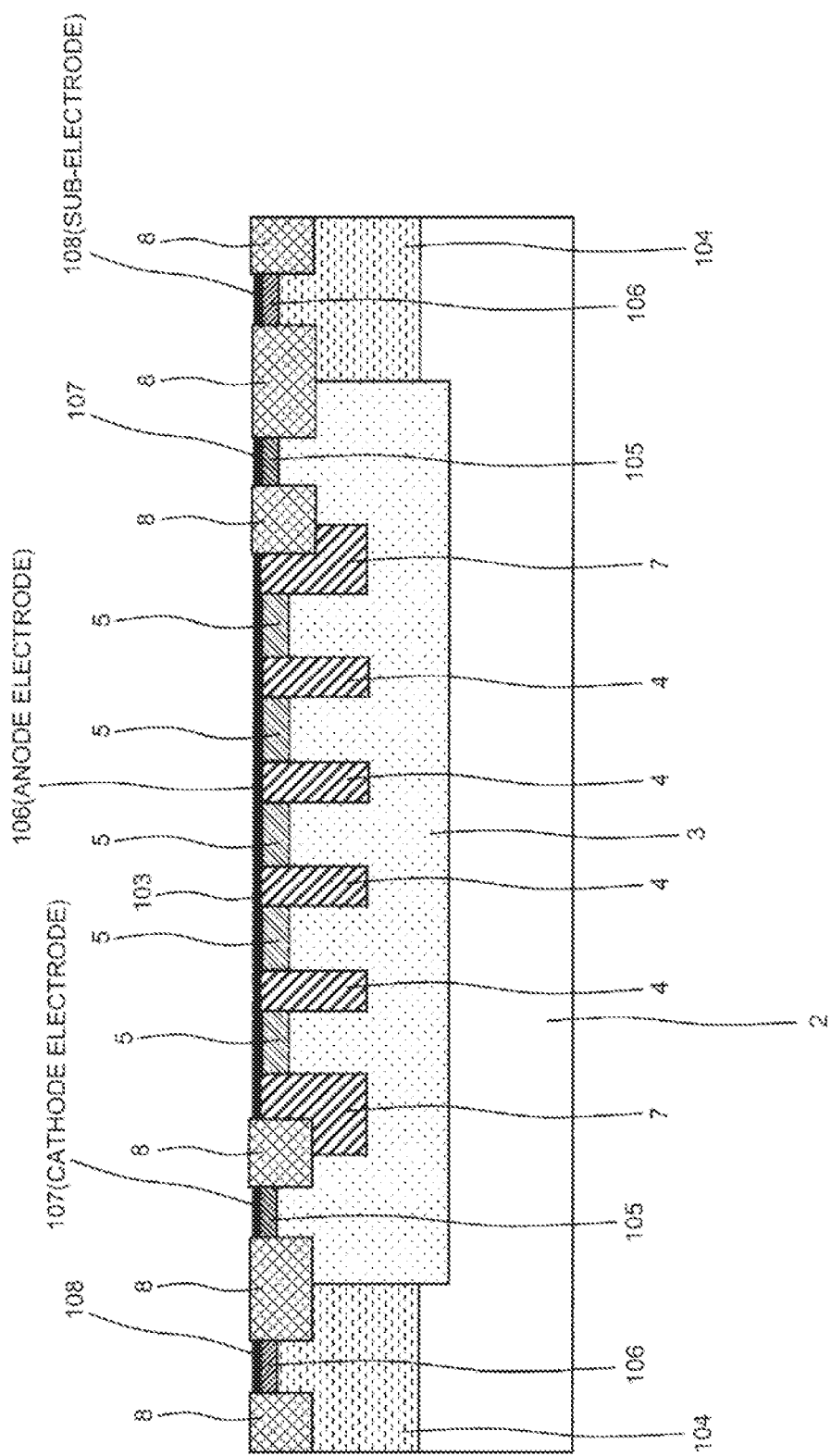
FIG. 19 is a longitudinal sectional diagram illustrating another longitudinal sectional structure in the main manufacturing process for manufacturing a JBS diode having a structure in which the p-type semiconductor regions are arranged in the staggered shape.
Figure 21:
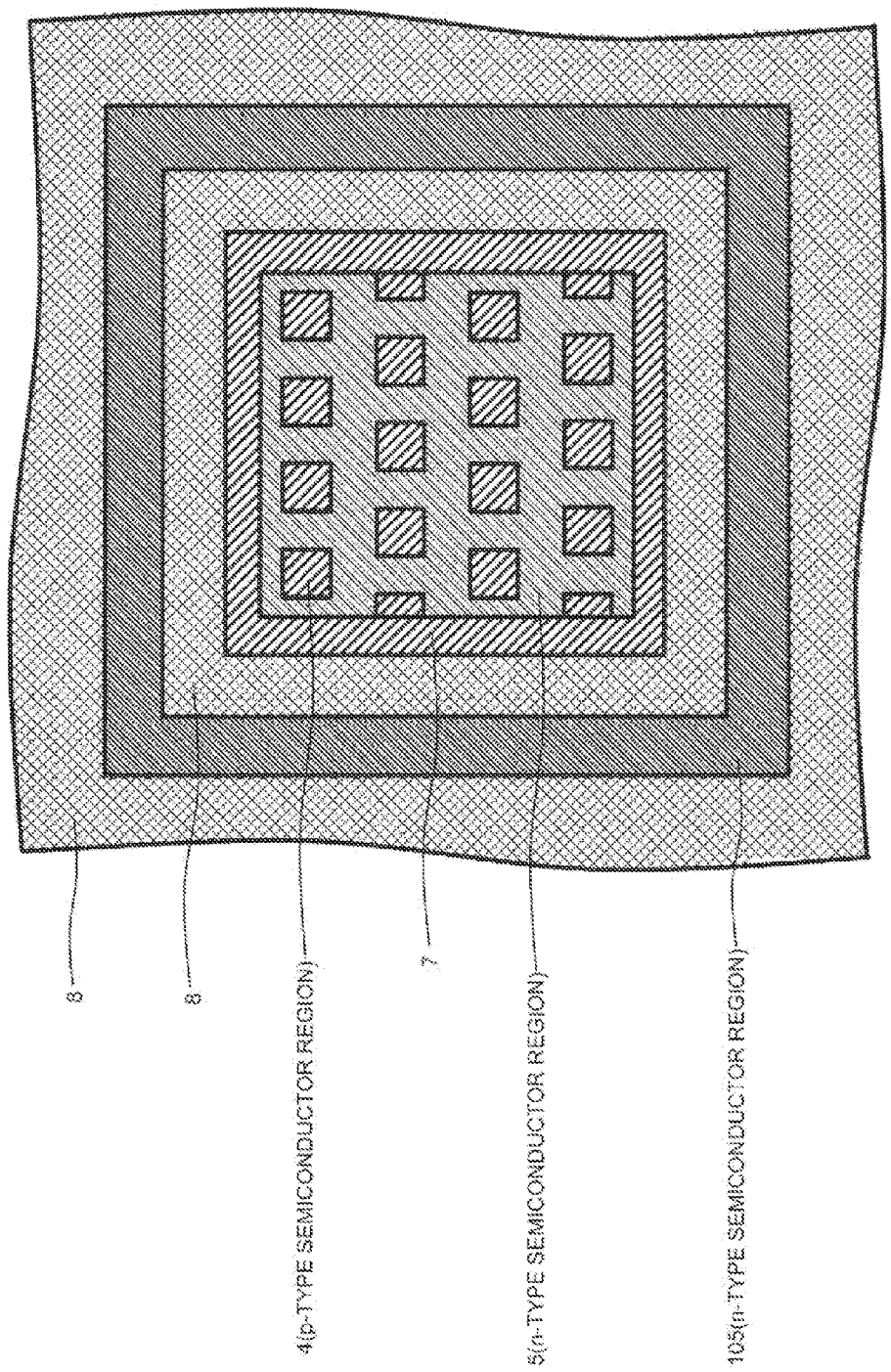
FIG. 21 is a plan view showing the planar configuration of a lower portion starting from electrodes formed of the silicide shown in FIG. 19.

Then, after removing the oxide film 103 on the surface, a metal film such as Ti, Co, or Ni is deposited using a sputtering method or the like and silicide is formed by heat treatment using a lamp annealing method, as shown in FIG. 19. In this case, the silicide inside the guard ring 7 is the anode electrode 6, and a region between the element isolation regions 8 outside the guard ring 7 is a cathode electrode 107. The silicide formed on the p-type region 106 is a sub-electrode 108. The sub-electrode is used in order to apply an electric potential to a p-type semiconductor substrate 4 by fixing the p-type semiconductor substrate 4 to the ground (GND), for example. In addition, the unnecessary metal film deposited on the element isolation region 8 is removed by wet etching. FIG. 21 shows the planar configuration of a lower portion from the electrodes 6, 107, and 108 formed of the silicide shown in FIG. 19.

Figure 20:
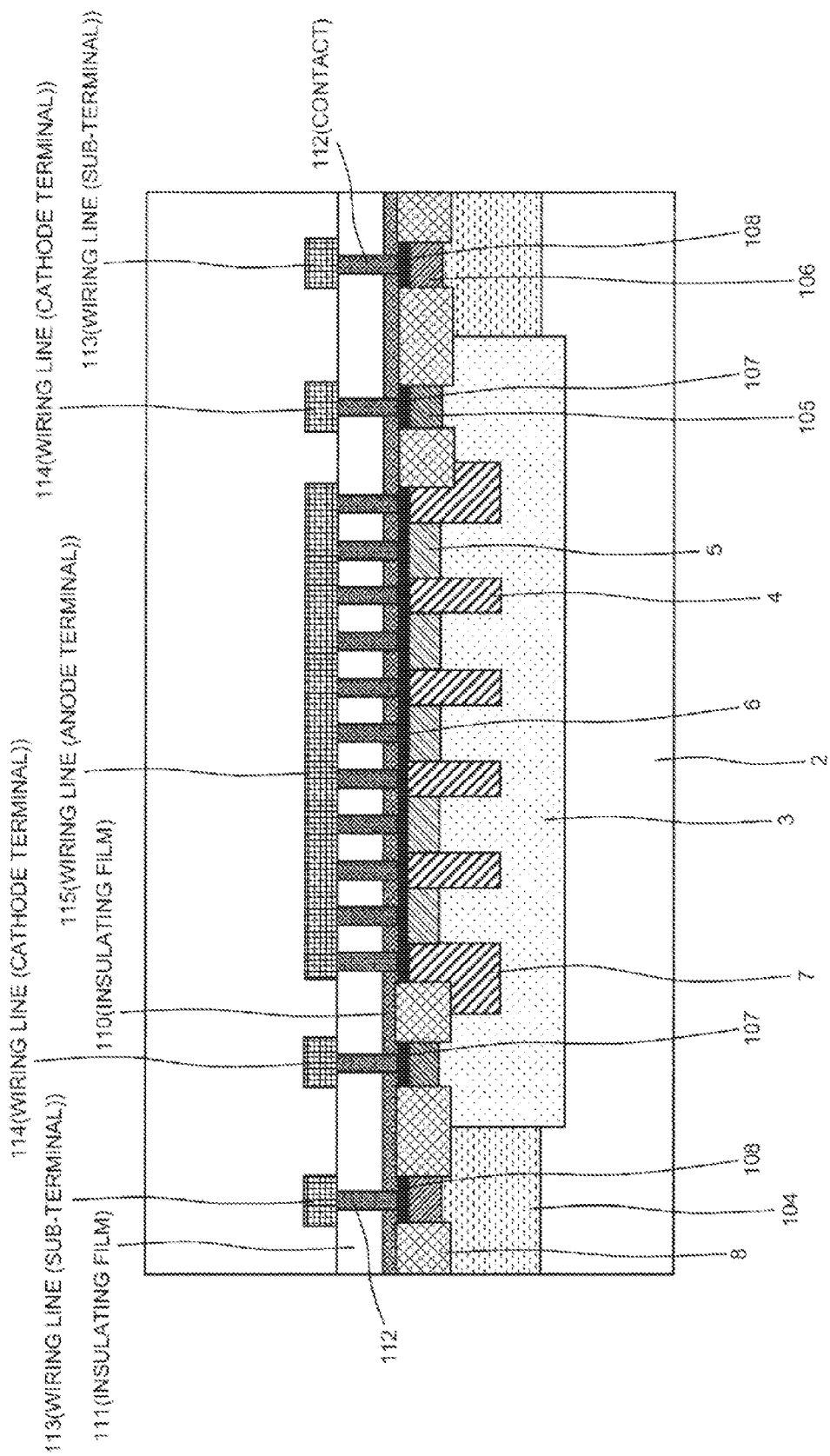
FIG. 20 is a longitudinal sectional diagram illustrating another longitudinal sectional structure in the main manufacturing process for manufacturing a JBS diode having a structure in which the p-type semiconductor regions are arranged in the staggered shape.

Then, as shown in FIG. 20, insulating films 110 and 111, such as a nitride film or an oxide film, are deposited using a chemical vapor deposition (CVD) method, and a contact 112 for a connection to the lower electrode at a required position is formed. On the contact 112, required wiring lines 113 to 115 are formed. In FIG. 20, the number of layers of the wiring lines 113 to 115 is one layer. However, the invention is not limited thereto, and the number of layers of the wiring lines 113 to 115 may be set to the required number of wiring layers.

While the invention made by the present inventors has been specifically described through the above embodiment, it is needless to say that the invention is not limited thereto and various modifications thereof can be made without departing from the spirit and scope of the invention.

Figure 22:
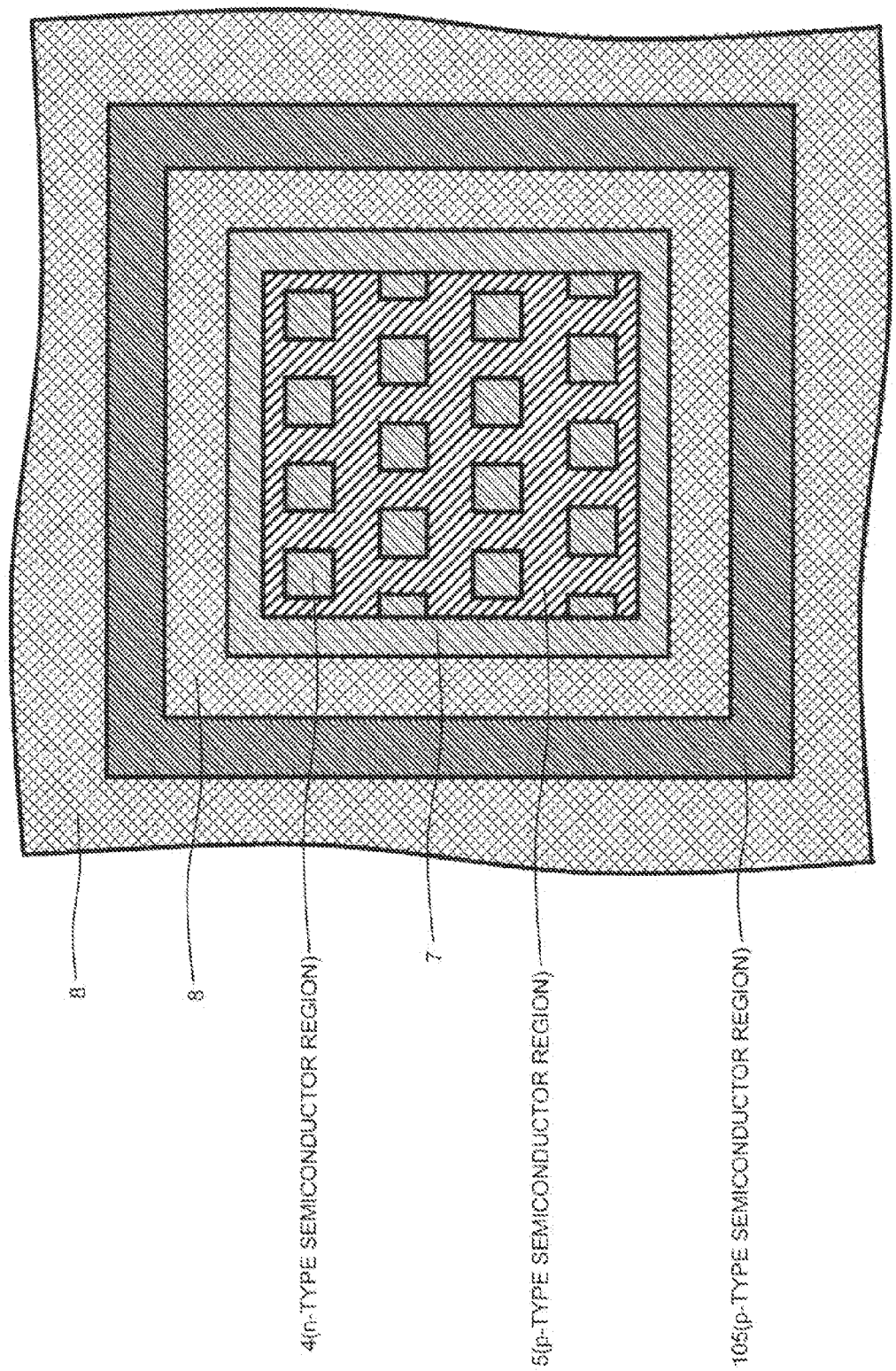
FIG. 22 is a plan view illustrating the planar configuration obtained by changing the conductivity type in FIG. 21.

For example, it is needless to say that it is possible to adopt a structure in which the n-type semiconductor region and the p-type semiconductor region are exchanged with each other in the above explanation. For example, in FIG. 22 showing the planar configuration obtained by changing the conductivity type in FIG. 21, 4 indicates the n-type semiconductor region that was changed from the p-type semiconductor region, and 5 indicates the p-type semiconductor region that was changed from the n-type semiconductor region. Also for other semiconductor regions (not shown), the conductivity types p and n are similarly changed. Also in the structure in which the conductivity types of the n-type region and the p-type region are changed, it is possible to obtain the same effects as described above except that the polarities are simply reversed. In this case, the wiring line 115 connected to the p-type semiconductor region 5 serves as a cathode terminal, and the wiring line 114 connected to the p-type semiconductor region 105 serves as an anode terminal. Similarly, the cathode electrode and the anode electrode that are diode electrodes are also interchanged with each other.

Figure 23:
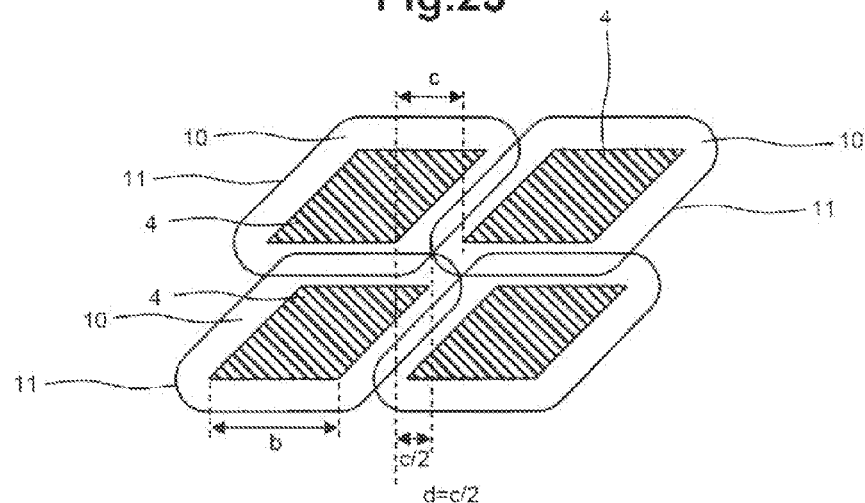
FIG. 23 is a diagram for explaining the conditions of the lower limit of the amount of shift corresponding to FIG. 7 when the quadrangular shape of each semiconductor region arranged in the staggered shape is a parallelogram.
Figure 24:
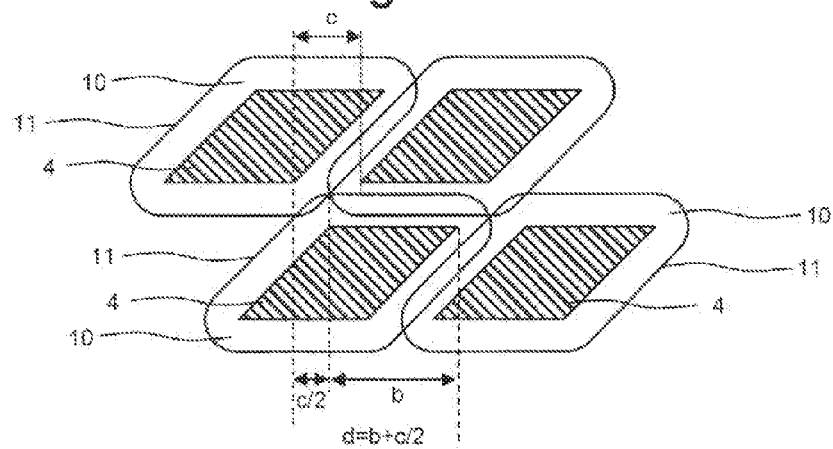
FIG. 24 is a diagram for explaining the conditions of the upper limit of the amount of shift corresponding to FIG. 8 when the quadrangular shape of each semiconductor region arranged in the staggered shape is a parallelogram.

In addition, although the quadrangular shape of each of the semiconductor regions 4 arranged in the staggered shape has been described as a square, the quadrangular shape of each semiconductor region 4 arranged in the staggered shape may be a parallelogram without being limited thereto. FIG. 23 is a diagram for explaining the amount of shift d corresponding to FIG. 7 when the p-type semiconductor region 4 is a parallelogram, and FIG. 24 is a diagram for explaining the amount of shift d corresponding to FIG. 8 when the p-type semiconductor region 4 is a parallelogram. As can be seen from FIGS. 23 and 24, also when the shape of each semiconductor region arranged in the staggered shape is a parallelogram (rhombus), depletion layers are connected to each other in the range satisfying the relationship of $c/2 \le d \le b+c/2$ as described above, assuming that the amount of shift between the adjacent columns of the p-type semiconductor regions 4, that is, the amount of shift between the upper and lower columns is d, the width of the p-type semiconductor region 4 is b, and the distance between the p-type semiconductor regions 4 in a column is c. Therefore, it is possible to obtain the same effects as described above.

In addition, the quadrangular shape of each semiconductor region 4 arranged in the staggered shape is not limited to being a square or a rhombus, and it is possible to obtain the same effects even if the quadrangular shape of each semiconductor region 4 arranged in the staggered shape is a rectangle or a slightly flat square.

The JBS diode according to the invention can be applied not only as a single diode but also to a large scale integrated circuit such as a CMOS integrated circuit in which the JBS diode is mounted as an on-chip circuit component. Furthermore, as the application function, the JBS diode according to the invention can be applied not only as a rectifier but also for latch-up prevention. For example, although the JBS diode according to the invention can be mounted as an on-chip circuit component in the LCD driver in order to avoid the latch-up that occurs easily in a transition period at the time of stepping-up/stepping-down of a gradation voltage used for the LCD driver, the JBS diode according to the invention can be widely applied to various semiconductor integrated circuits without being limited thereto. In particular, when NiSi ($\phi b=0.75$ eV) should be used as silicide instead of CoSi ($\phi b=0.64$ eV), the forward current is reduced due to its characteristics. In order to increase the forward current and reduce the reverse current, it is also possible to use the JBS diode according to the invention.

Certain embodiments of the invention may be described as a method. In first example, a method for manufacturing a junction barrier Schottky diode may include forming a first semiconductor region of a first conductivity type on a semiconductor substrate; forming a plurality of second semiconductor regions of a second conductivity type in a staggered arrangement in the first semiconductor region, pn junction regions being formed at predetermined distances between the plurality of second semiconductor regions and the first semiconductor region; forming a third semiconductor region of the first conductivity type on the first semiconductor region between the second semiconductor regions in order to form a Schottky junction region; and forming an electrode on the second and third semiconductor regions, wherein each of the second semiconductor regions is formed in a quadrangular shape in plan view from the electrode, the second semiconductor regions arranged at equal distances in an X direction are formed in a plurality of columns in a Y direction, and an amount of shift between adjacent columns in the X direction is set such that a Y-direction distance between the second semiconductor regions in the different columns is larger than an X-direction distance between the second semiconductor regions in each of the columns.

In a second example, a method for manufacturing a junction barrier Schottky diode may include forming a first semiconductor region of a first conductivity type on a semiconductor substrate; forming a plurality of second semiconductor regions of a second conductivity type in a plurality of rows and columns in the first semiconductor region, with pn junction regions being formed at predetermined distances between the plurality of second semiconductor regions and the first semiconductor region; forming a third semiconductor region of the first conductivity type on the first semiconductor region between the second semiconductor regions in order to form a Schottky junction region; and forming an electrode on the second and third semiconductor regions so as to overlap each other, wherein each of the second semiconductor regions has a quadrangular shape having a side with a length b in plan view from the electrode, and wherein a distance between adjacent second semiconductor regions in the one side direction is c, a distance between adjacent second semiconductor regions in a direction crossing the one side direction is larger than the distance c, and an amount of shift d between adjacent second semiconductor regions in adjacent columns extending in the one side direction of the second semiconductor region satisfies a relationship of $c/2 \le d \le b+c/2$.

In a third example, a method for manufacturing a junction barrier Schottky diode may include forming a first semiconductor region of a first conductivity type on a semiconductor substrate; forming a plurality of second semiconductor regions of a second conductivity type in a plurality of rows and columns in the first semiconductor region, with pn junction regions being formed at predetermined distances between the plurality of second semiconductor regions and the first semiconductor region; forming a third semiconductor region of the first conductivity type on the first semiconductor region between the second semiconductor regions in order to form a Schottky junction region; and forming an electrode on the second and third semiconductor regions, wherein each of the second semiconductor regions has a quadrangular shape having a side with a length b in plan view from the electrode, and wherein an extendable size of a depletion layer from an edge of the second semiconductor region when a predetermined reverse voltage is applied is a in the plan view, a distance between adjacent second semiconductor regions in the one side direction is $a\sqrt{2}$, a distance between adjacent second semiconductor regions in a direction crossing the one side direction is $a+a/\sqrt{2}$, and an amount of shift d between adjacent second semiconductor regions in adjacent columns extending in the one side direction of the second semiconductor region satisfies a relationship of $a/\sqrt{2} \le d \le b+a/\sqrt{2}$.

In a fourth example, the method for manufacturing a junction barrier Schottky diode according to the first, second, or third example may further include that the second semiconductor region is any of a square, a rectangle, and a parallelogram.

In a fifth example, the method for manufacturing a junction barrier Schottky diode according to third example may include that the amount of shift d between adjacent second semiconductor regions in the one side direction is b/2.

In a sixth example, the method for manufacturing a junction barrier Schottky diode according to third example may include that the predetermined reverse voltage is an allowable reverse voltage.

What is claimed is:

1. A junction barrier Schottky diode, comprising:
a first semiconductor region of a first conductivity type formed on a semiconductor substrate;
a plurality of second semiconductor regions of a second conductivity type that are formed in a staggered arrangement in the first semiconductor region, pn junction regions being formed at predetermined distances between the plurality of second semiconductor regions and the first semiconductor region;
a third semiconductor region of the first conductivity type that is formed between the second semiconductor regions in order to form a Schottky junction region; and
an electrode formed on the second and third semiconductor regions,
wherein each of the second semiconductor regions has a quadrangular shape in plan view from the electrode,
wherein the staggered arrangement comprises a plurality of staggered rows extending in an X direction and a plurality of overlapping columns extending in a Y direction, wherein the second semiconductor regions within each row of the plurality of staggered rows are arranged with an equal X-direction spacing, and
wherein an amount of shift along the X direction between adjacent columns of the plurality of columns is set such that a Y-direction distance between adjacent second semiconductor regions of the adjacent columns is larger than the X-direction spacing.

2. The junction barrier Schottky diode according to claim 1, wherein the quadrangular shape of each of the second semiconductor regions is any of a square, a rectangle, and a parallelogram.

3. A junction barrier Schottky diode, comprising:
a first semiconductor region of a first conductivity type formed on a semiconductor substrate;
a plurality of second semiconductor regions of a second conductivity type that are formed in a plurality of rows and columns in the first semiconductor region, pn junction regions being formed at predetermined distances between the plurality of second semiconductor regions and the first semiconductor region;
a third semiconductor region of the first conductivity type that is formed between the second semiconductor regions in order to form a Schottky junction region; and
an electrode formed on the second and third semiconductor regions, wherein each of the second semiconductor regions has a quadrangular shape having a side extending along a first direction with a length "b" in plan view from the electrode, and
a distance between adjacent second semiconductor regions in along a second direction crossing the first direction is larger than a distance "c", wherein the distance c is defined between adjacent second semiconductor regions along the first direction, and an amount of shift "d" along the first direction between adjacent second semiconductor regions in adjacent columns satisfies a relationship of $(c/2) \le d \le (b+c/2)$.

4. The junction barrier Schottky diode according to claim 3, wherein the quadrangular shape of each of the second semiconductor regions is any of a square, a rectangle, and a parallelogram.

5. A junction barrier Schottky diode, comprising:
a first semiconductor region of a first conductivity type formed on a semiconductor substrate;
a plurality of second semiconductor regions of a second conductivity type that are formed in a plurality of rows and columns in the first semiconductor region, pn junction regions being formed at predetermined distances between the plurality of second semiconductor regions and the first semiconductor region;
a third semiconductor region of the first conductivity type that is formed between the second semiconductor regions in order to form a Schottky junction region; and
an electrode formed on the second and third semiconductor regions, wherein
each of the second semiconductor regions has a quadrangular shape having a side extending along a first direction with a length "b" in plan view from the electrode, and
an extendable size of a depletion layer from an edge of each second semiconductor region when a predetermined reverse voltage is applied is represented by a first distance "a" in the plan view, a second distance between adjacent second semiconductor regions along the first direction is $(a\sqrt{2})$, a distance between adjacent second semiconductor regions in a second direction crossing the first direction is $(a+a/\sqrt{2})$, and an amount of shift "d" along the first direction between adjacent second semiconductor regions in adjacent columns satisfies a relationship of $(a/\sqrt{2}) \le d \le (b+a/\sqrt{2})$.

6. The junction barrier Schottky diode according to claim 5, wherein the quadrangular shape of each of the second semiconductor regions is any of a square, a rectangle, and a parallelogram.

7. The junction barrier Schottky diode according to claim 5, wherein the amount of shift d between the adjacent second semiconductor regions in adjacent columns is (b/2).

8. The junction barrier Schottky diode according to claim 5, wherein the predetermined reverse voltage is an allowable reverse voltage.

* * * * *